(12) United States Patent
Lee et al.

(10) Patent No.: US 10,818,672 B2
(45) Date of Patent: Oct. 27, 2020

(54) SEMICONDUCTOR MEMORY DEVICE AND METHOD OF MANUFACTURING THE SAME

(71) Applicant: SAMSUNG ELECTRONICS CO., LTD., Suwon-si, Gyeonggi-do (KR)

(72) Inventors: Hyun-jung Lee, Seongnam-si (KR); Dongsoo Woo, Seoul (KR); Jin-Seong Lee, Gyeonggi-do (KR); Namho Jeon, Hwaseong-si (KR); Jaeho Hong, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/405,548

(22) Filed: May 7, 2019

(65) Prior Publication Data
US 2019/0267386 A1 Aug. 29, 2019

Related U.S. Application Data

(63) Continuation of application No. 15/920,628, filed on Mar. 14, 2018, now Pat. No. 10,312,243.

(30) Foreign Application Priority Data

Jul. 21, 2017 (KR) .......................... 10-2017-0092879

(51) Int. Cl.
*H01L 27/108* (2006.01)
*H01L 29/423* (2006.01)
(Continued)

(52) U.S. Cl.
CPC .. *H01L 27/10876* (2013.01); *H01L 27/10814* (2013.01); *H01L 27/10823* (2013.01);
(Continued)

(58) Field of Classification Search
CPC .......... H01L 27/10876; H01L 29/4236; H01L 29/4983; H01L 29/66659; H01L 27/10823;
(Continued)

(56) References Cited

U.S. PATENT DOCUMENTS

| 8,901,630 B2 | 12/2014 | Huh et al. |
| 9,178,039 B2 | 11/2015 | Park et al. |

(Continued)

FOREIGN PATENT DOCUMENTS

| KR | 101194973 | 10/2012 |
| KR | 1020140073705 | 6/2014 |

(Continued)

*Primary Examiner* — Patricia D Reddington
(74) *Attorney, Agent, or Firm* — F. Chau & Associates, LLC

(57) ABSTRACT

A semiconductor memory device includes a separation member defining active regions of a substrate. Gate lines intersect the active regions and are each buried in a trench formed in the substrate. Each of the gate lines includes a lower electrode structure and an upper electrode structure on the lower electrode structure. The upper electrode structure includes a source layer substantially covering a sidewall of the trench and including a work-function adjustment element. A conductive layer is on the source layer. A work-function adjustment layer is disposed between the source layer and the conductive layer. The work-function adjustment layer includes a material different from that of the source layer and is doped with the work-function adjustment element.

20 Claims, 22 Drawing Sheets

(51) Int. Cl.

| | | |
|---|---|---|
| *H01L 29/49* | (2006.01) | |
| *H01L 29/66* | (2006.01) | |
| *H01L 29/43* | (2006.01) | |
| *H01L 21/8238* | (2006.01) | |
| *H01L 29/51* | (2006.01) | |
| *H01L 21/3215* | (2006.01) | |

(52) U.S. Cl.
CPC ...... *H01L 29/4236* (2013.01); *H01L 29/4983* (2013.01); *H01L 29/66659* (2013.01); *H01L 21/3215* (2013.01); *H01L 21/823842* (2013.01); *H01L 27/10844* (2013.01); *H01L 27/10897* (2013.01); *H01L 29/42368* (2013.01); *H01L 29/42376* (2013.01); *H01L 29/435* (2013.01); *H01L 29/4958* (2013.01); *H01L 29/4966* (2013.01); *H01L 29/517* (2013.01)

(58) Field of Classification Search
CPC ....... H01L 27/10814; H01L 21/823842; H01L 29/517; H01L 27/10897; H01L 29/42368; H01L 29/4958; H01L 29/435; H01L 29/42376; H01L 29/4966; H01L 27/10847
See application file for complete search history.

(56) References Cited

U.S. PATENT DOCUMENTS

| | | | |
|---|---|---|---|
| 9,530,849 | B2 | 12/2016 | Oh et al. |
| 9,634,011 | B2 | 4/2017 | Kang et al. |
| 2014/0077281 | A1 | 3/2014 | Won et al. |
| 2014/0154877 | A1 | 6/2014 | Besser et al. |
| 2014/0363960 | A1 | 12/2014 | Kim et al. |
| 2016/0260813 | A1 | 9/2016 | Cho et al. |
| 2016/0315164 | A1 | 10/2016 | Son et al. |
| 2017/0084615 | A1* | 3/2017 | Lee ................... H01L 27/10814 |
| 2017/0125422 | A1 | 5/2017 | Kang |
| 2017/0365608 | A1 | 12/2017 | Lee et al. |
| 2019/0027480 | A1 | 1/2019 | Lee et al. |

FOREIGN PATENT DOCUMENTS

| | | |
|---|---|---|
| KR | 1020150090674 | 8/2015 |
| KR | 1020170141975 | 12/2017 |

* cited by examiner

SEMICONDUCTOR MEMORY DEVICE AND METHOD OF MANUFACTURING THE SAME

CROSS-REFERENCE TO RELATED APPLICATIONS

This application is a continuation of U.S. patent application Ser. No. 15/920,628 filed on Mar. 14, 2018, which claims priority under 35 U.S.C. § 119 to Korean Patent Application No. 10-2017-0092879, filed on Jul. 21, 2017, in the Korean Intellectual Property Office, the disclosures of which are incorporated by reference herein in their entireties.

TECHNICAL FIELD

Exemplary embodiments of the present inventive concept relate to a semiconductor memory device and, more particularly, to a method of manufacturing the same and.

DISCUSSION OF RELATED ART

Semiconductor devices are widely used in electronics industries. Semiconductor devices may have relatively small sizes, multi-functional characteristics, and/or relatively low manufacture costs. Semiconductor devices may be categorized as any one of semiconductor memory devices storing logical data, semiconductor logic devices processing logical data, and hybrid semiconductor devices having both the function of the semiconductor memory devices and the function of the semiconductor logic devices.

Relatively high-speed and relatively low-voltage semiconductor devices may satisfy desired characteristics (e.g., high speed and/or low power consumption) of electronic devices including semiconductor devices. Semiconductor devices may be relatively highly integrated. Reliability of semiconductor devices may be reduced by relatively high integration density of the semiconductor devices.

SUMMARY

An exemplary embodiment of the present inventive concept provides a semiconductor memory device with increased electrical conductivity characteristics and a method of manufacturing the same.

According to an exemplary embodiment of the present inventive concept, a semiconductor memory device includes a separation member defining active regions of a substrate. Gate lines intersect the active regions and are each buried in a trench formed in the substrate. Each of the gate lines includes a lower electrode structure and an upper electrode structure on the lower electrode structure. The upper electrode structure includes a source layer substantially covering a sidewall of the trench and including a work-function adjustment element. A conductive layer is on the source layer. A work-function adjustment layer is disposed between the source layer and the conductive layer. The work-function adjustment layer includes a material different from that of the source layer and is doped with the work-function adjustment element.

According to an exemplary embodiment of the present inventive concept, a semiconductor memory device includes a substrate including a separation member defining active regions arranged in a first direction. Gate lines are each buried in a trench formed in an upper portion of the substrate. The gate lines intersect the active regions in a second direction intersecting the first direction to divide the active regions into first dopant injection regions and second dopant injection regions. A bit line is disposed on the gate lines and extends in a third direction intersecting both the first and second directions to intersect the gate lines. Each of the gate lines includes a first diffusion layer and a second diffusion layer formed along a bottom surface and a sidewall of the trench. A work-function adjustment layer is disposed between the first diffusion layer and the second diffusion layer. A conductive layer is on the second diffusion layer. The first diffusion layer, the second diffusion layer and the work-function adjustment layer include a metal nitride. The work-function adjustment layer is doped with a work-function adjustment element different from a metal element of the metal nitride.

According to an exemplary embodiment of the present inventive concept, a method of manufacturing a semiconductor memory device includes forming a separation member defining active regions in a substrate, and forming gate lines intersecting the active regions and buried in the substrate. The forming of the gate lines includes forming trenches intersecting the active regions in the substrate. The forming of the gate lines includes forming a lower electrode structure filling a lower portion of each of the trenches. The forming of the gate lines includes sequentially forming a source layer and a first diffusion layer on a sidewall and a bottom surface of each of the trenches, the source layer including a work-function adjustment element. The forming of the gate lines includes forming a conductive layer on the first diffusion layer. The forming of the gate lines includes forming a work-function adjustment layer having a work function lower than that of the first diffusion layer by diffusing the work-function adjustment element from the source layer into at least a portion of the first diffusion layer.

BRIEF DESCRIPTION OF THE DRAWINGS

The above and other features of the inventive concept will become more apparent by describing in detail exemplary embodiments thereof, with reference to the accompanying drawings, in which.

DETAILED DESCRIPTION OF THE EMBODIMENTS

Figure 1:
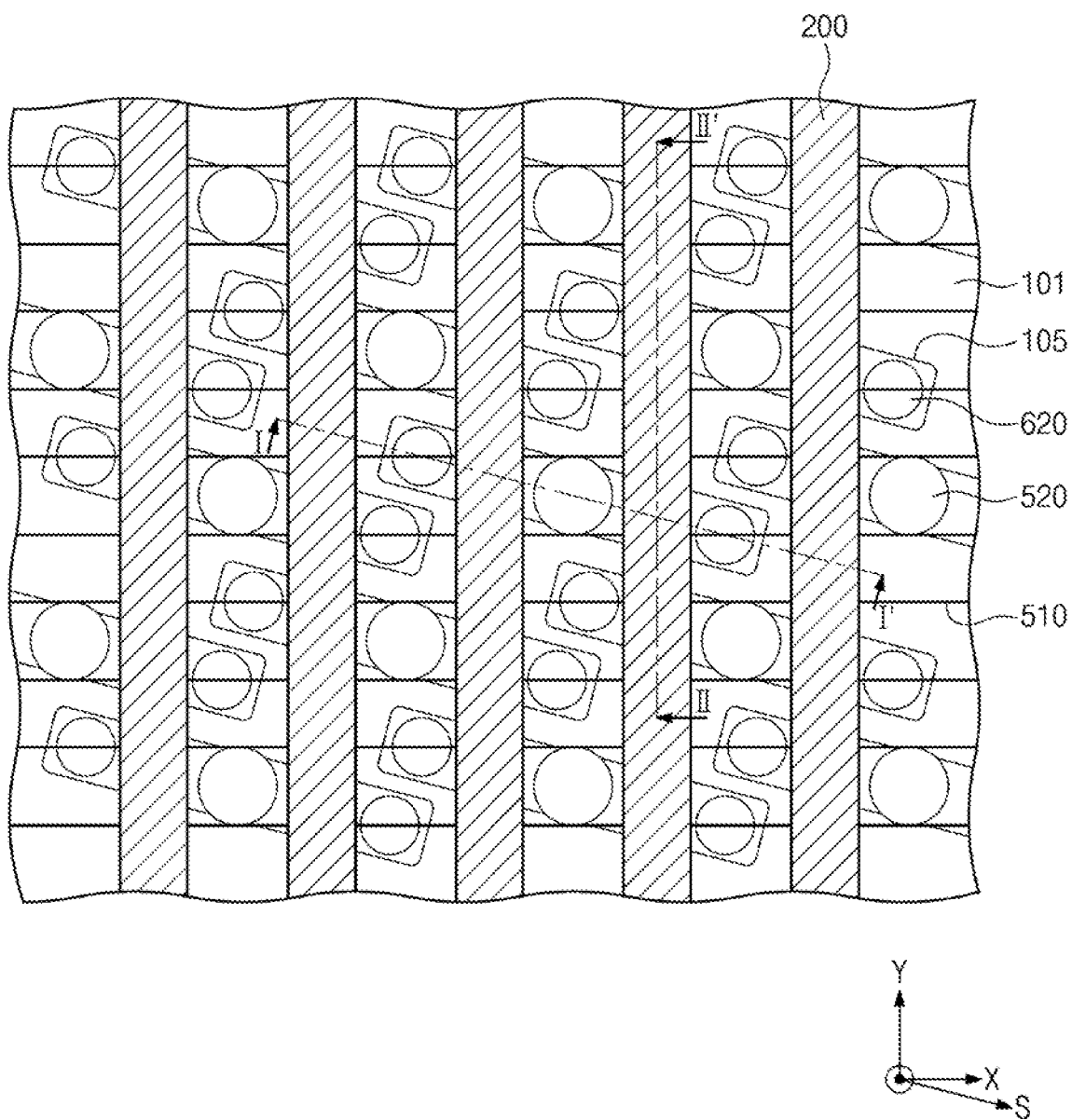
FIG. 1 is a plan view illustrating a semiconductor memory device according to an exemplary embodiment of the present inventive concept.

Exemplary embodiments of the present inventive concept will be described below in more detail with reference to the accompanying drawings. In this regard, the present inventive concept may have different forms and should not be construed as being limited to the exemplary embodiments of the present inventive concept described herein. Like reference numerals may refer to like elements throughout the specification and drawings.

Figure 2A:
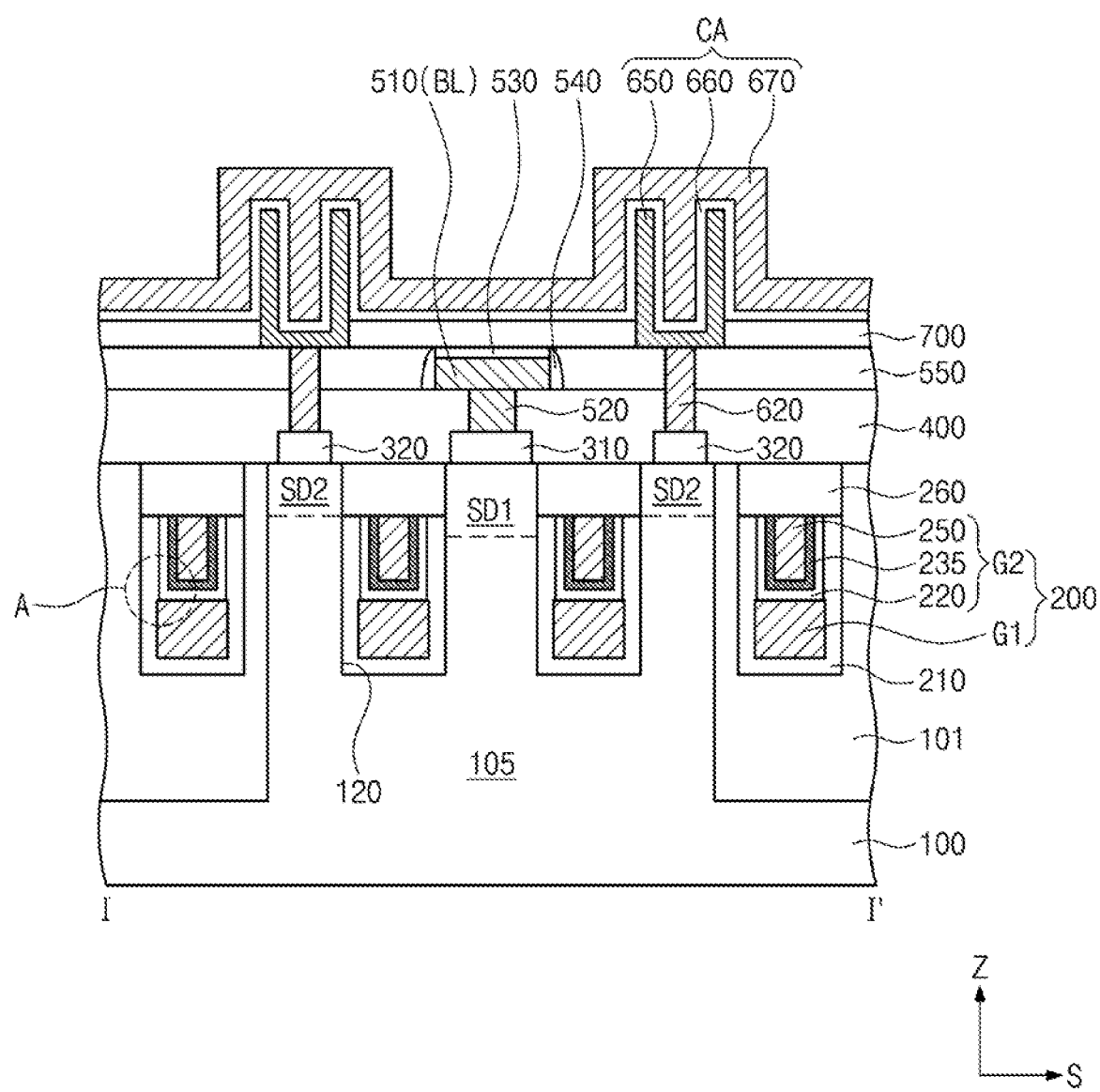
FIGS. 2A and 2B are cross-sectional views taken along lines I-I' and II-II' of FIG. 1, respectively, illustrating a semiconductor memory device according to an exemplary embodiment of the present inventive concept.
Figure 2B:
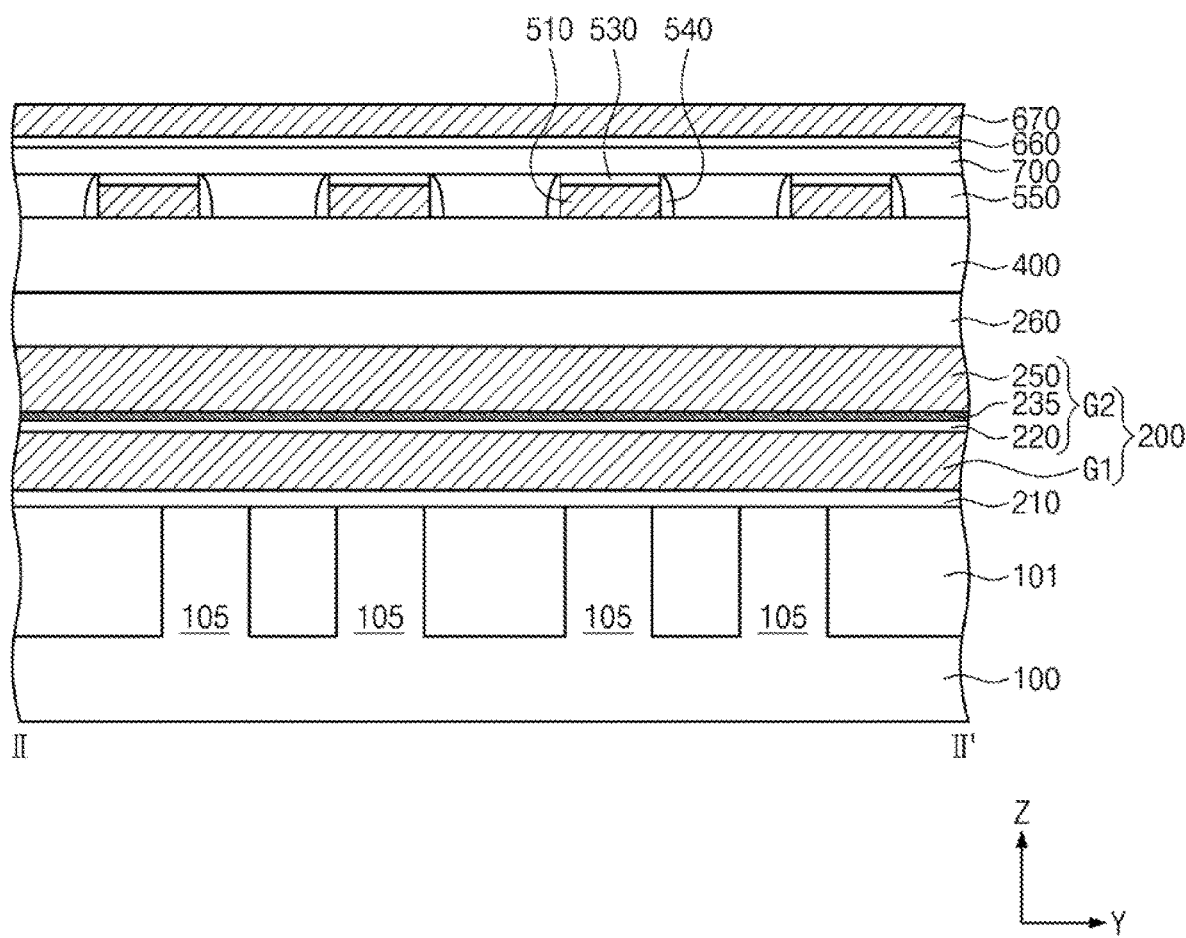
Figure 3:
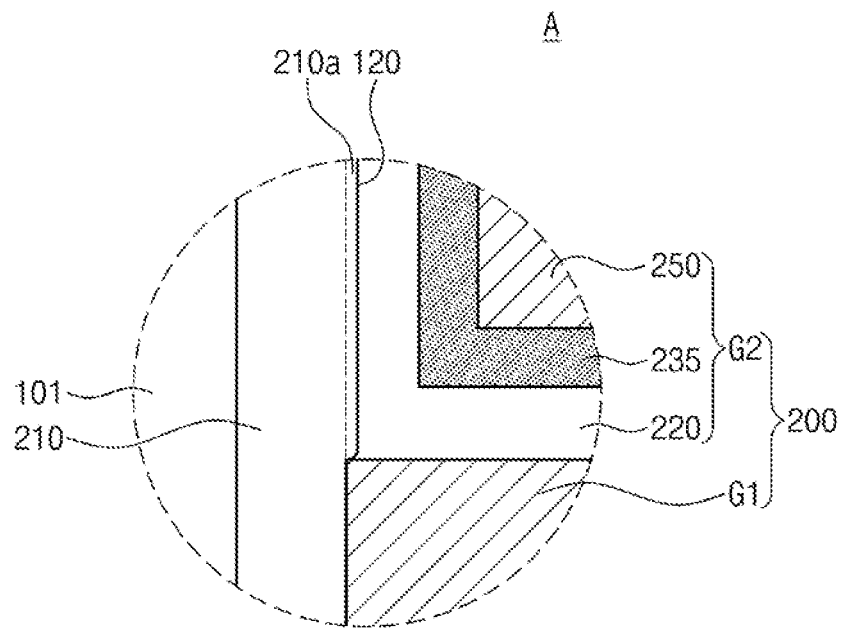
FIGS. 3 to 5 are enlarged views corresponding to a region 'A' of FIG. 2A illustrating a semiconductor memory device according to an exemplary embodiment of the present inventive concept.
Figure 4:
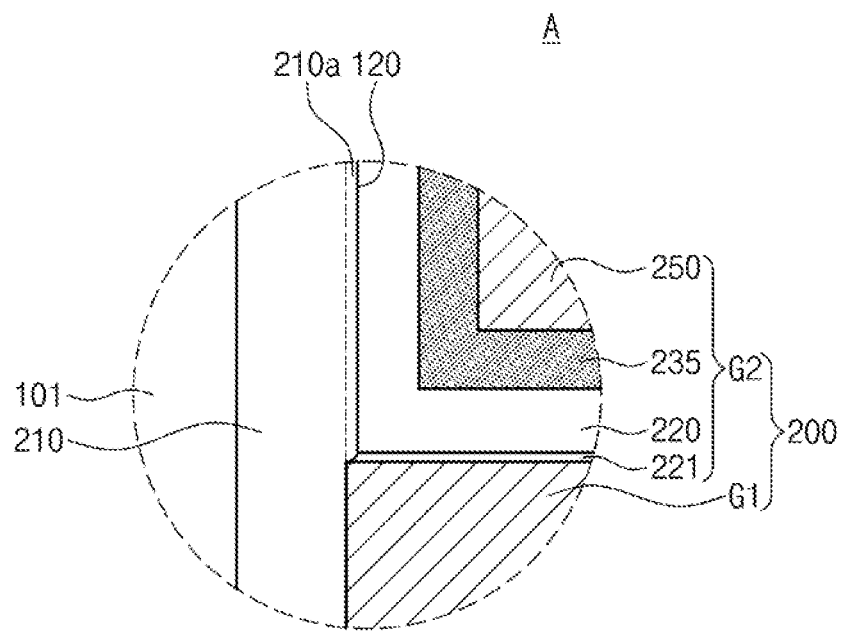
Figure 5:
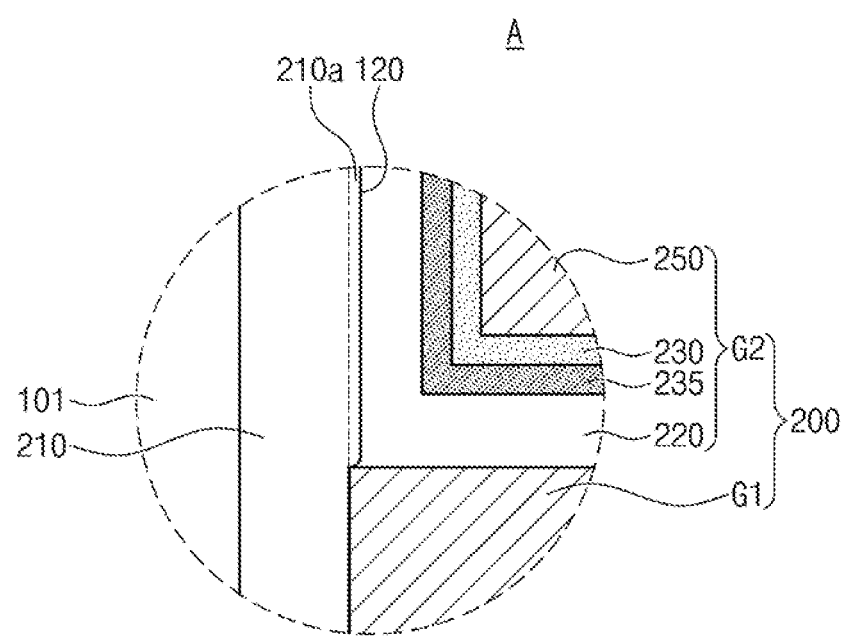

FIG. 1 is a plan view illustrating a semiconductor memory device according to an exemplary embodiment of the present inventive concept. FIGS. 2A and 2B are cross-sectional views taken along lines I-I' and II-II' of FIG. 1, respectively, illustrating a semiconductor memory device according to an exemplary embodiment of the present inventive concept. FIG. 2A is a cross-sectional view taken along a line I-I' of FIG. 1, and FIG. 2B is a cross-sectional view taken along a line II-II' of FIG. 1. FIGS. 3 to 5 are views illustrating semiconductor memory devices according to some embodiments of the inventive concept. FIGS. 3 to 5 are enlarged views corresponding to a region 'A' of FIG. 2A illustrating a semiconductor memory device according to an exemplary embodiment of the present inventive concept.

Referring to FIGS. 1, 2A, and 2B, a separation member 101 may be disposed in a substrate 100. The separation member 101 may define active regions 105. The substrate 100 may include a semiconductor substrate. For example, the semiconductor substrate may be a silicon substrate, a germanium substrate, or a silicon-germanium substrate. Each of the active regions 105 may have a bar (e.g., substantially rectangular) shape in a plan view and may have a long axis that is parallel to a third direction S intersecting both a first direction X and a second direction Y intersecting the first direction X. A fourth direction Z is perpendicular to the first to third directions X, Y and S. FIG. 2A illustrates a Z-S cross section, and FIG. 2B illustrates a Z-Y cross section.

A plurality of gate lines 200 intersecting the active regions 105 in a plan view may be disposed in the substrate 100. The gate lines 200 may be word lines. The gate lines 200 may extend in the second direction Y and may be arranged in the first direction X. The gate lines 200 may be gate lines buried in the substrate 100. For example, each of the gate lines 200 may be disposed in one of trenches 120 formed in the substrate 100, which extend to intersect the active regions 105. Each of the gate lines 200 may include a lower electrode structure G1 and an upper electrode structure G2. A work function of the lower electrode structure G1 may be higher than a work function of the upper electrode, structure G2.

Referring to FIGS. 2A, 2B, and 3, the lower electrode structure G1 may be disposed in a lower portion of the trench 120. The lower electrode structure G1 may include a conductive material. For example, the conductive material may include at least one of a doped semiconductor material (e.g., doped silicon (Si) or doped germanium (Ge)), a conductive metal nitride (e.g., titanium nitride or tantalum nitride), a metal (e.g., tungsten (W), titanium (Ti), or tantalum (Ta)), or a metal-semiconductor compound (e.g., tungsten silicide, cobalt silicide, or titanium silicide). The lower electrode structure G1 may include a metal of which a resistivity is lower than that of the upper electrode structure G2. The upper gate electrode G2 may be in direct contact with the lower gate electrode G1.

The upper electrode structure G2 may be disposed on the lower electrode structure G1 and may fill a portion of the trench 120. A top surface of the upper electrode structure G2 may be disposed at a lower level than a top surface of the substrate 100. The upper electrode structure G2 may include a source layer 220, a work-function adjustment layer 235, and a conductive layer 250.

The source layer 220 may conformally cover at least a portion of the trench 120 of the substrate 100. For example, the source layer 220 may cover at least a portion of a sidewall of the trench 120 and a bottom surface (e.g., a top surface of the lower electrode structure G1) of the trench 120. A cross section of the source layer 220 may have a U-shape. The source layer 220 may include a work-function adjustment element or a compound (e.g., an oxide or a nitride) of the work-function adjustment element. The work-function adjustment element is defined as an element that can change or adjust a work function of a metal or metal nitride. For example, the work-function adjustment element may include a metal such as lanthanum (La), strontium (Sr), antimony (Sb), yttrium (Y), aluminum (Al), tantalum (Ta), hafnium (Hf), iridium (Ir), zirconium (Zr), or magnesium (Mg). However, the work-function adjustment element is not limited thereto. As an example, the source layer 220 may expose the bottom surface of the trench 120 (e.g., at least a portion of the upper surface of the lower electrode structure G1). The source layer 220 covering the bottom surface of the trench 120 will be described below as an example.

The work-function adjustment layer 235 may be disposed on the source layer 220. The work-function adjustment layer 235 may be in direct contact with the source layer 220. The work-function adjustment layer 235 may conformally cover an inner sidewall of the source layer 220. A cross section of the work-function adjustment layer 235 may have a U-shape. The work-function adjustment layer 235 may include a metal material doped with the work-function adjustment element or a nitride of the metal material doped with the work-function adjustment element. The metal material may include a metal element different from the work-function adjustment element. For example, the metal material may include the metal element such as titanium (Ti) or tungsten (W). A work function of the work-function adjustment layer 235 doped with the work-function adjustment element may be lower than a work function when it is not doped with the work-function adjustment element. The work function of the work-function adjustment layer 235 may be lower than that of the lower electrode structure G1.

The conductive layer 250 may be disposed on the work-function adjustment layer 235. The conductive layer 250 may be in direct contact with the work-function adjustment layer 235. The conductive layer 250 may at least partially fill a portion of the trench 120 on the work-function adjustment layer 235. For example, the conductive layer 250 may fill an inner space surrounded by the work-function adjustment layer 235. The conductive layer 250 may be spaced apart from the source layer 220 by the work-function adjustment layer 235. A resistance of the conductive layer 250 may be lower than a resistance of the work-function adjustment layer 235. The conductive layer 250 may include a relatively low-resistance material. For example, the conductive layer 250 may include a metal (e.g., tungsten (W), titanium (Ti), or tantalum (Ta)) or a conductive metal nitride (e.g., tungsten nitride (WN)). A work function of the conductive layer 250 may be higher than the work function of the work-function adjustment layer 235.

A top surface of the source layer 220, a top surface of the work-function adjustment layer 235 and a top surface of the conductive layer 250 may be disposed at the same level. The top surface of the source layer 220, the top surface of the work-function adjustment layer 235 and the top surface of the conductive layer 250 may be disposed at a lower level than the top surface of the substrate 100.

Gate insulating patterns 210 may be disposed between the gate lines 200 and the active regions 105 and may also be disposed between the separation member 101 and the gate lines 200. According to an exemplary embodiment of the present inventive concept s, a portion 210a of the gate insulating pattern 210 adjacent to the upper electrode structure G2 may protrude into the trench 120 (see, e.g., FIG. 3). For example, the portion 210a of the gate insulating pattern 210 may laterally protrude toward the conductive layer 250 on the lower electrode structure G1. The gate insulating patterns 210 may include an oxide, a nitride, and/or an oxynitride.

In an exemplary embodiment of the present inventive concept, the upper electrode structure G2 and the lower electrode structure G1 may be spaced apart from each other. A gap 221 may be formed between the source layer 220 and the lower electrode structure G1 (see, e.g., FIG. 4). The gap 221 may be surrounded by the source layer 220, the gate insulating pattern 210 (e.g., the portion 210a of the gate insulating pattern 210), and the lower electrode structure G1 and thus may be sealed. The gap 221 may be substantially filled with oxygen or nitrogen oxygen or nitrogen in a gaseous form).

In an exemplary embodiment of the present inventive concept, a semiconductor member device may include the substrate 100 including a plurality of active regions 105. Gate lines 200 may be positioned in the active regions 105 in trenches 120 formed in the substrate 100. Each of the gate lines 200 may include the lower electrode structure G1 and the upper electrode structure G2 disposed on the lower electrode structure G1. The upper electrode structure G2 may include the source layer 220 substantially covering a sidewall of the trench 120 and including a work-function adjustment element. The conductive layer 250 may be positioned above the source layer 220. The work-function adjustment layer 235 may be disposed between the source layer 220 and the conductive layer 250. The work-function adjustment layer 235 may include a material different from that of the source layer 220 and may be doped with the work-function adjustment element. The gap 221 may be formed between the lower electrode structure G1 and the upper electrode structure G2.

In an exemplary embodiment of the present inventive concept, a diffusion layer 230 may be disposed between the source layer 220 and the conductive layer 250. The diffusion layer 230 may separate the source layer 220 and the conductive layer 250 from each other (see, e.g., FIG. 5). As an example, a first side of the diffusion layer 230 may be in direct contact with the conductive layer 250 and a second side of the diffusion layer 230 may be in direct contact with the work-function adjustment layer 235. In an exemplary embodiment of the present inventive concept, the diffusion layer 230 may be disposed between the work-function adjustment layer 235 and the conductive layer 250. The diffusion layer 230 may include the same metal material or the same nitride of the metal material as the work-function adjustment layer 235, but the diffusion layer 230 need not be doped with the work-function adjustment element. In an exemplary embodiment of the present inventive concept, the diffusion layer 230 need not be provided.

Referring again to FIGS. 1, 2A, and 2B, first capping patterns 260 may be disposed on the gate lines 200. Top surfaces of the first capping patterns 260 may be coplanar with the top surface of the substrate 100. The first capping patterns 260 may include a silicon oxide layer, a silicon nitride layer, and/or a silicon oxynitride layer. In an exemplary embodiment of the present inventive concept, bottom surfaces of the first capping patterns 260 may be in direct contact with top surfaces of the gate insulating patterns 210, and both sidewalls of the first capping patterns 260 may be in direct contact with the active regions 105 and/or the separation member 101. In an exemplary embodiment of the present inventive concept, the gate insulating patterns 210 may extend between the first capping patterns 260 and the active regions 105 and/or between the separation member 101 and the first capping patterns 260. In this case, the gate insulating patterns 210 disposed between the first capping patterns 260 and the active regions 105 may act as a buffer that relaxes or buffers stress between the first capping patterns 260 and the active regions 105.

A first dopant injection region SD1 and a second dopant injection region SD2 may be disposed in each active region 105 adjacent to opposite sidewalls of each gate line 200, respectively. The first dopant injection region SD1 and the second dopant injection region SD2 may extend from the surface of the substrate 100 into the substrate 100. A conductivity type of the first and second dopant injection regions SD1 and SD2 may be different from a conductivity type of the substrate 100. For example, when the substrate 100 is a P-type, the first and second dopant injection regions SD1 and SD2 may be N-type. Each of the dopant injection regions SD1 and SD2 may in a position corresponding to a source region or a drain region.

In the semiconductor memory device, according to an exemplary embodiment of the present inventive concept, the work-function adjustment layer 235 having a relatively low work function may be disposed outside the conductive layer 250 of the upper electrode structure G2 to reduce or minimize a gate-induced drain leakage current (GIDL) generated from the gate lines 200 to the dopant injection regions SD1 and SD2. In addition, the work function of the upper electrode structure G2 may be adjusted by adjusting a doping concentration of the work-function adjustment layer 235. Thus, a desired low work function of the upper electrode structure G2 may be achieved.

The portion 210a of the gate insulating pattern 210 adjacent to the upper electrode structure G2 may protrude toward the upper electrode structure G2. As an example, the gate insulating pattern 210 may have a relatively thick width at a position adjacent to the upper electrode structure G2, and thus the leakage current caused by the gate lines 200 may be further reduced.

In the semiconductor memory device, according to an exemplary embodiment of the present inventive concept, the GIDL may be reduced by reducing the work function in the upper electrode structure G2 of the gate line 200. However, the work function of the lower electrode structure G1 of the gate line 200 need not be reduced, and thus a threshold voltage may be maintained at a relatively high level.

Referring again to FIGS. 1, 2A, and 2B, first pads 310 may be disposed to be connected to the first dopant injection regions SD1, and second pads 320 may be disposed to be connected to the second dopant injection regions SD2. The first pads 310 and the second pads 320 may include a conductive material such as poly-silicon doped with dopants, or a metal.

A first interlayer insulating layer 400 may be disposed on the pads 310 and 320. The first interlayer insulating layer 400 may include at least one of a silicon oxide layer, a silicon nitride layer, or a silicon oxynitride layer. Bit lines 510 may be disposed on the first interlayer insulating layer 400. The bit lines 510 may be provided in a second interlayer insulating layer 550 disposed on the first interlayer insulating layer 400. The second interlayer insulating layer 550 may include at least one of a silicon oxide layer, a silicon nitride layer, or a silicon oxynitride layer. The bit lines 510 may each be connected to direct contacts 520 that penetrate the first interlayer insulating layer 400 to be connected to the first pads 310. For example, the bit lines 510 and the direct contacts 520 may include at least one of a doped semiconductor material (e.g., doped silicon or doped germanium), a conductive metal nitride (e.g., titanium nitride or tantalum nitride), a metal (e.g., tungsten, titanium, or tantalum), or a metal-semiconductor compound (e.g., tungsten silicide, cobalt silicide, or titanium silicide). Second capping patterns 530 may be disposed on the bit lines 510, and opposite sidewalls of each of the bit lines 510 may be covered with insulating spacers 540. The second capping patterns 530 and the insulating spacers 540 may include at least one of a silicon nitride layer, a silicon oxide layer, or a silicon oxynitride layer.

Buried contacts 620 may be disposed on the substrate 100. The buried contacts 620 may penetrate the first and second interlayer insulating layers 400 and 550 and may be connected to the second pads 320. The buried contacts 620 may include a conductive material such as doped silicon and/or a metal. Data storage components may be disposed on the second interlayer insulating layer 550 and may be connected to the buried contacts 620. In an exemplary embodiment of the present inventive concept, the data storage component may be a capacitor CA. The capacitor CA may include a first electrode 650, a second electrode 670, and a dielectric layer 660 disposed between the first electrode 650 and the second electrode 670. The first electrode 650 may have a hollow cylindrical shape having a closed bottom end. The second electrode 670 may be a common electrode commonly covering the first electrodes 650. The first and second electrodes 650 and 670 may include at least one of doped silicon, a metal, or a metal compound. A support layer 700 may be disposed between the second electrode 670 and the second interlayer insulating layer 550. The support layer 700 may be disposed on an outer sidewall of the first electrode 650 to inhibit or prevent the first electrode 650 from leaning. The support layer 700 may include an insulating material. The dielectric layer 660 may extend to be disposed between the support layer 700 and the second electrode 670.

Figure 6A:
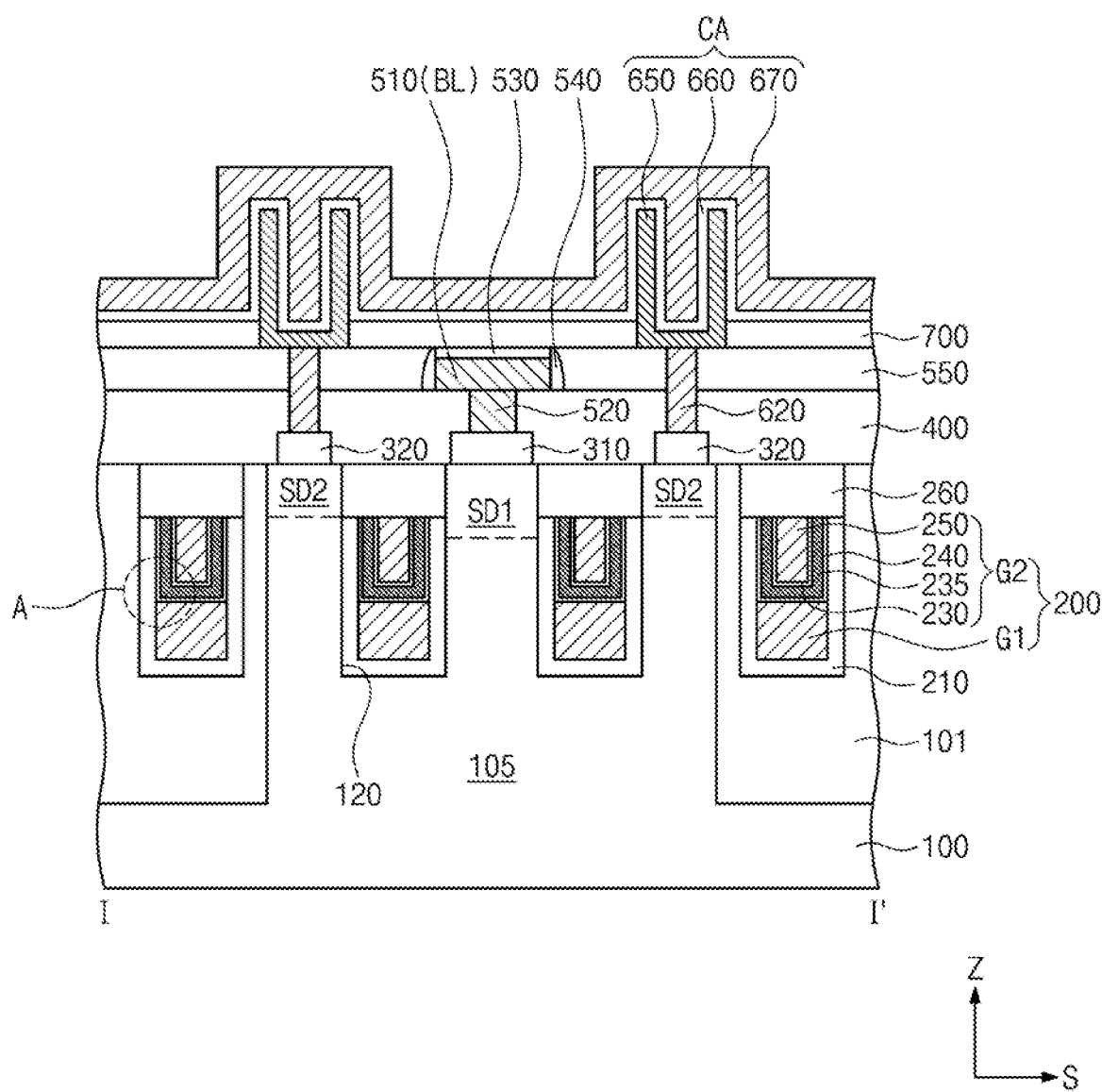
FIGS. 6A and 6B are cross-sectional views taken along the lines I-I' and II-II' of FIG. 1, respectively, illustrating a semiconductor memory device according to an exemplary embodiment of the present inventive concept.
Figure 6B:
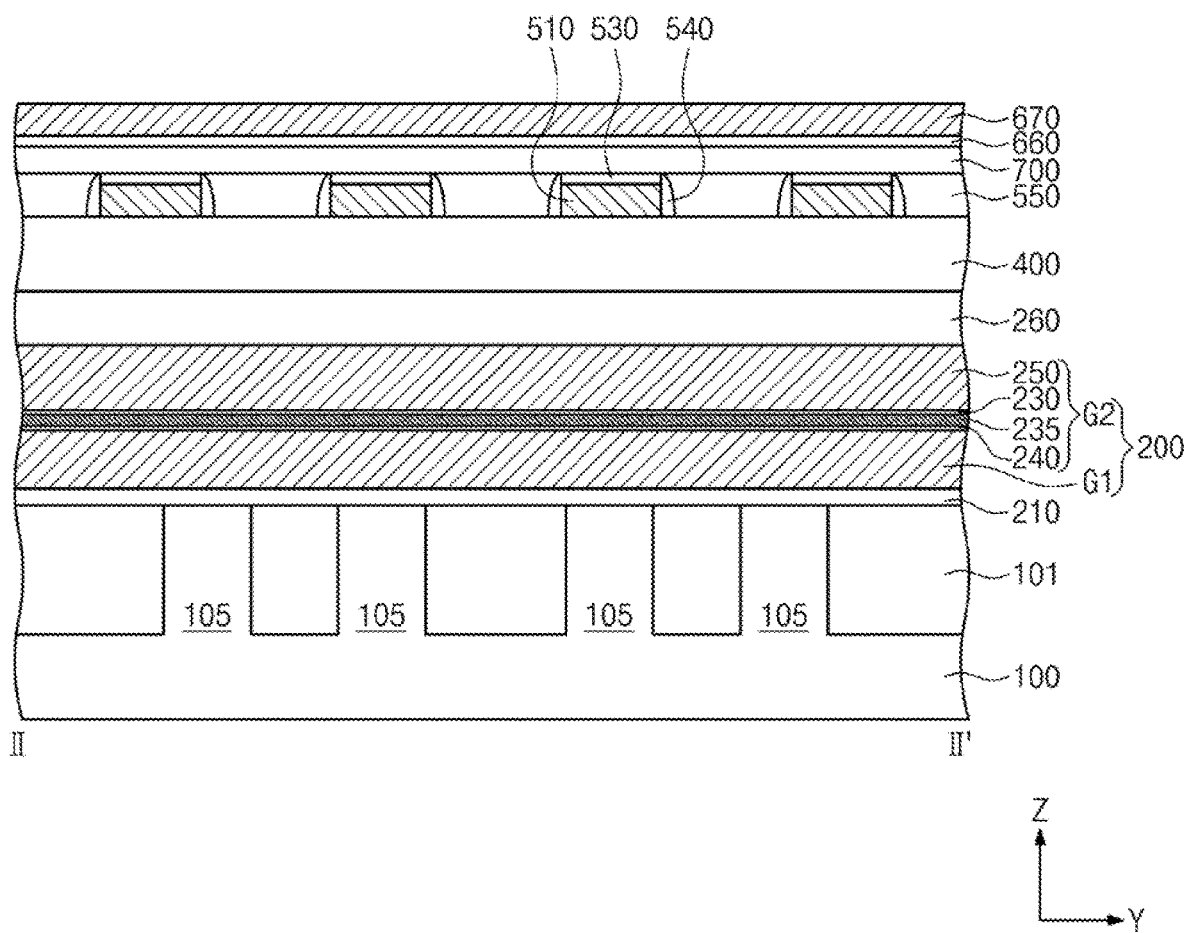
Figure 7:
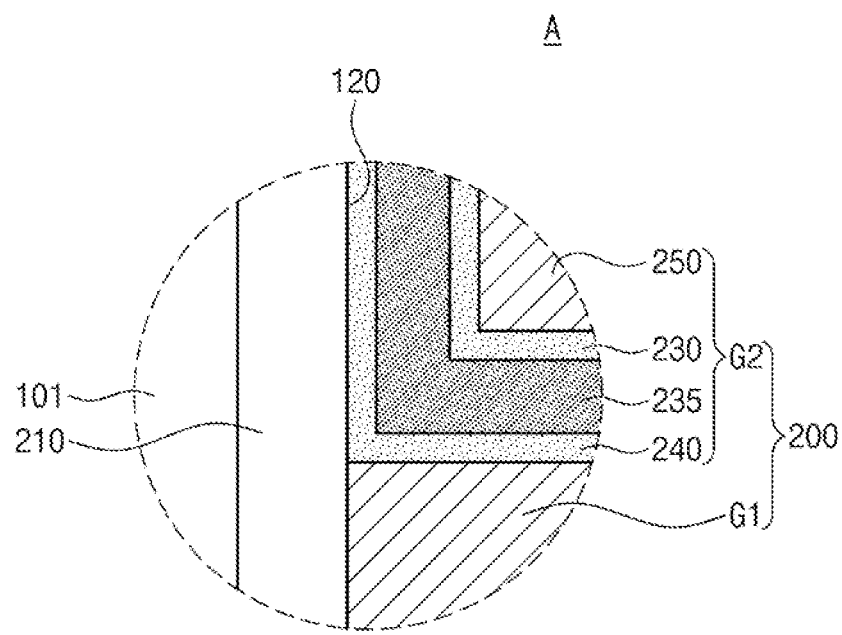
FIGS. 7 and 8 are enlarged views corresponding to a region 'A' of FIG. 6A illustrating a semiconductor memory device according to an exemplary embodiment of the present inventive concept.
Figure 8:
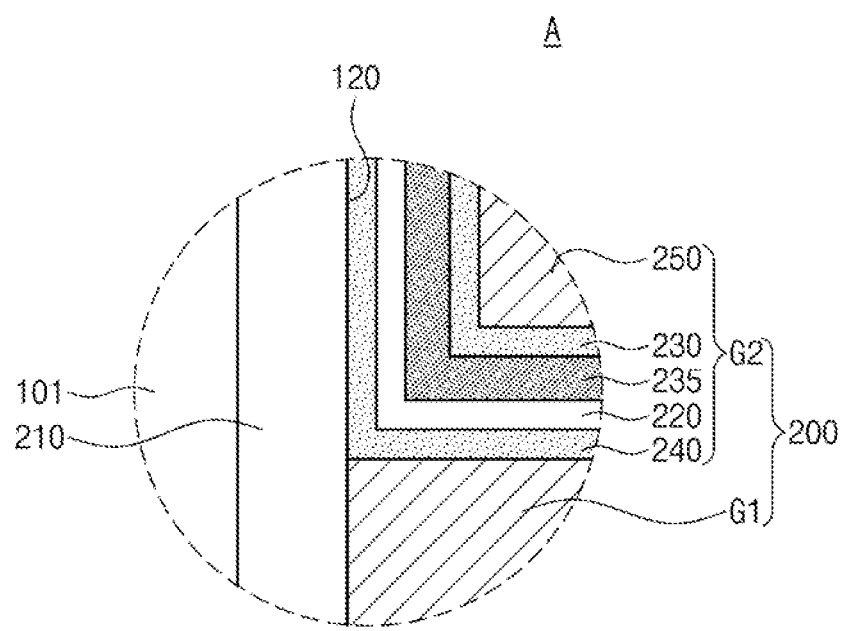

FIGS. 6A and 6B are cross-sectional views taken along the lines I-I' and II-II' of FIG. 1, respectively, illustrating a semiconductor memory device according to an exemplary embodiment of the present inventive concept. FIGS. 7 and 8 are enlarged views corresponding region 'A' of FIG. 6A illustrating a semiconductor memory device according to an exemplary embodiment of the present inventive concept. As an example, a planar shape of a semiconductor memory device will be described in more detail below with reference to FIG. 1; however, exemplary embodiments of the present inventive concept are not limited thereto.

Referring to FIGS. 1, 6A, and 6B, a plurality of gate lines 200 may be disposed in the substrate 100 and may intersect active regions 105 when viewed in a plan view. The gate lines 200 may each be disposed in trenches 120 of the substrate 100, which extend to intersect the active regions 105. The lower electrode structure G1 of the gate line 200 may be disposed in a lower portion of each of the trenches 120. The lower electrode structure G1 may include a conductive material.

The upper electrode structure G2 of the gate line 200 may be disposed on the lower electrode structure G1 to fill a portion of the trench 120. A top surface of the upper electrode structure G2 may be disposed at a lower level than a top surface of the substrate 100. The upper electrode structure G2 may include the first diffusion layer 230, the work-function adjustment layer 235, a second diffusion layer 240, and the conductive layer 250.

Referring to FIGS. 6A, 6B, and 7, the second diffusion layer 240 may conformally cover at least a portion of the trench 120 of the substrate 100 and the first diffusion layer 230 may be disposed on the second diffusion layer 240. For example, the second diffusion layer 240 may cover at least a portion of a sidewall of the trench 120 and a bottom surface (e.g., a top surface of the lower electrode structure G1) of the trench 120. Cross sections of the first and second diffusion layers 230 and 240 may each have U-shapes. The first and second diffusion layers 230 and 240 may each include a metal material or a nitride of the metal material. The metal material may include a metal element such as titanium or tungsten.

The work-function adjustment layer 235 may be disposed between the first and second diffusion layers 230 and 240. A cross section of the work-function adjustment layer 235 may have a U-shape. The work-function adjustment layer 235 may include the same metal material or the same nitride of the metal material as the first and second diffusion layers 230 and 240. The work-function adjustment layer 235 may be doped with the work-function adjustment element. The work-function adjustment element may include a metal element of which a work function is lower than that of the metal material. For example, the work-function adjustment element may include a metal such as lanthanum, strontium, antimony, yttrium, aluminum, tantalum, hafnium, iridium, zirconium, or magnesium. A work function of the work-function adjustment layer 235 doped with the work-function adjustment element may be lower than a work function when it is not doped with the work-function adjustment element. The work function of the work-function adjustment layer 235 may be lower than that of the lower electrode structure G1.

The conductive layer 250 may be disposed on the work-function adjustment layer 235. For example, the conductive layer 250 may be in direct contact with the first diffusion layer 230. The conductive layer 250 may partially fill the trench 120 on the work-function adjustment layer 235. A resistance of the conductive layer 250 may be lower than a resistance of the work-function adjustment layer 235. The conductive layer 250 may include a relatively low-resistance material. For example, the conductive layer 250 may include a metal (e.g., tungsten, titanium, or tantalum) or a conductive metal nitride (e.g., tungsten nitride). A work function of the conductive layer 250 may be higher than the work function of the work-function adjustment layer 235.

Gate insulating patterns 210 may be disposed between the gate lines 200 and the active regions 105 and may also be disposed between the separation member 101 and the gate lines 200.

In an exemplary embodiment of the present inventive concept, the source layer 220 may be disposed between the second diffusion layer 240 and the work-function adjustment layer 235. Referring to FIG. 8, the source layer 220 may separate the second diffusion layer 240 from the work-function adjustment layer 235. The source layer 220 may include the work-function adjustment element. For example, the source layer 220 may include the work-function adjustment element or a compound of the work-function adjustment element. Referring to FIG. 8, the source layer 220 may be disposed between the second diffusion layer 240 and the work-function adjustment layer 235. Alternatively, the source layer 220 may be disposed between the first diffusion layer 230 and the work-function adjustment layer 235. In an exemplary embodiment of the present inventive concept, the source layer 220 need not be provided.

Figure 10A:
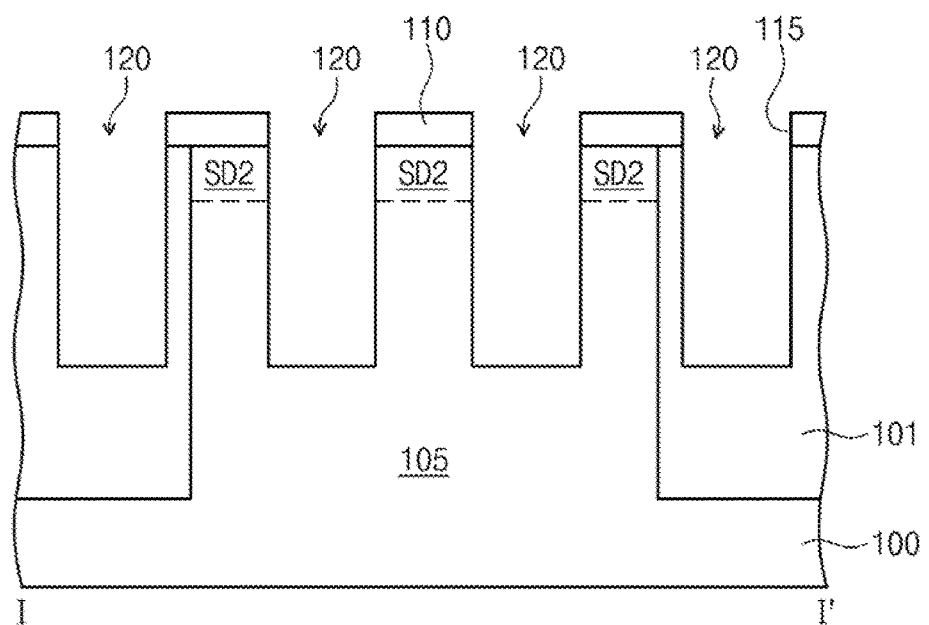
Figure 10A:
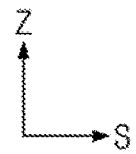
Figure 10B:
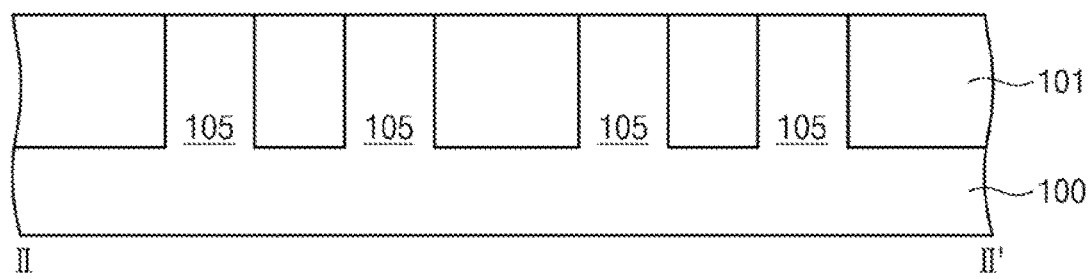
Figure 10B:
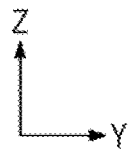
Figure 11A:
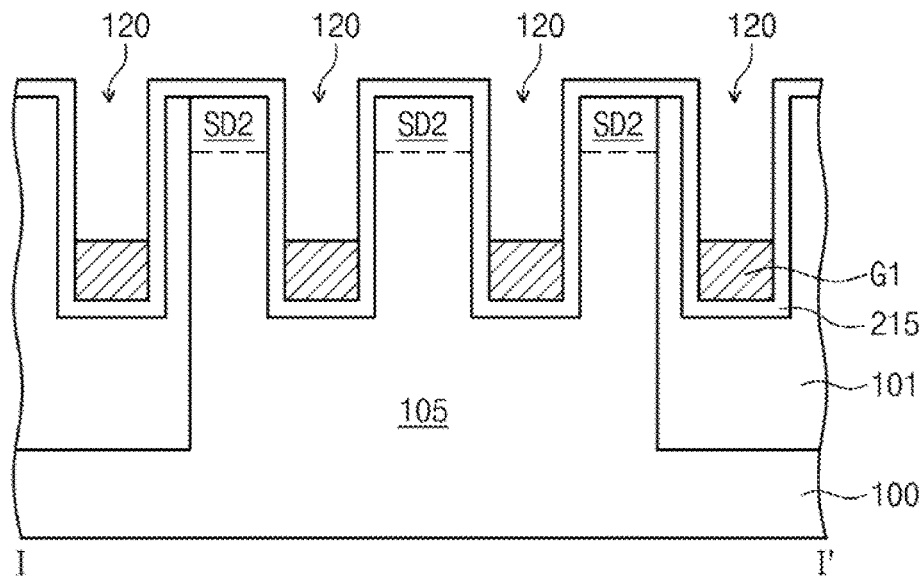
Figure 11B:
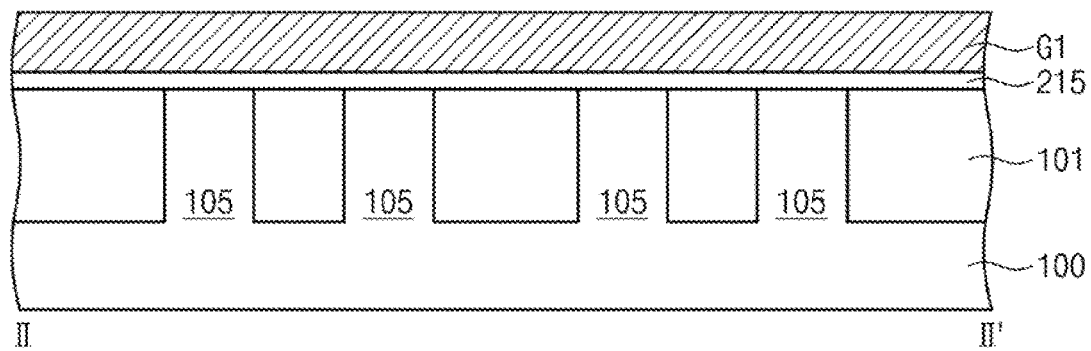
Figure 12A:
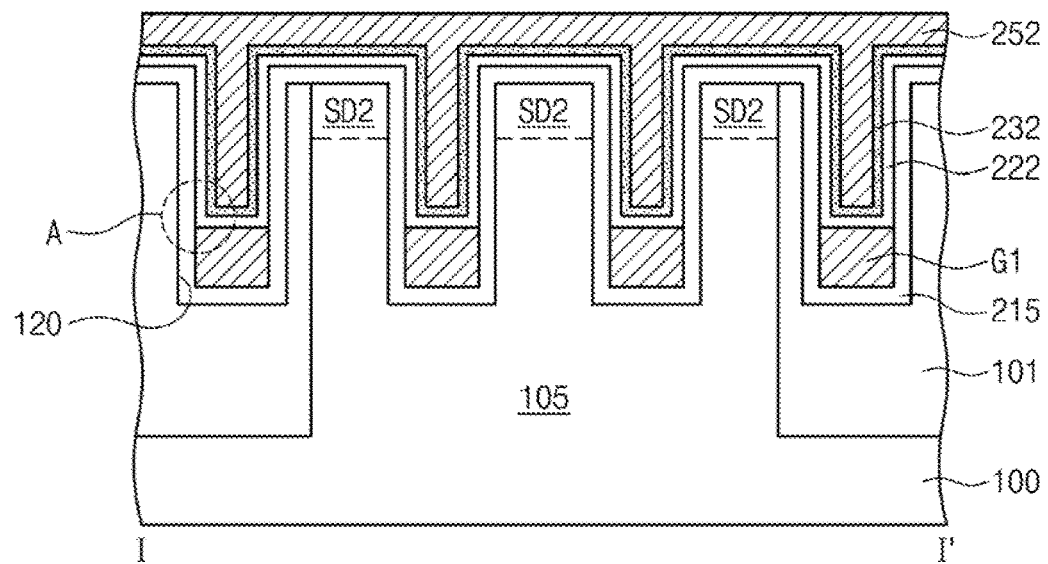
Figure 12B:
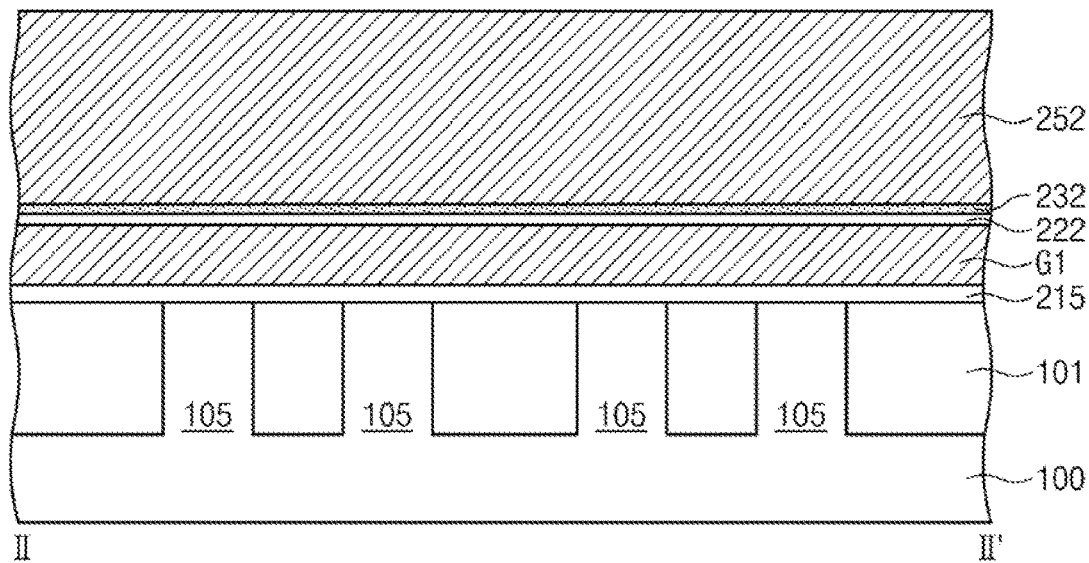
Figure 12C:
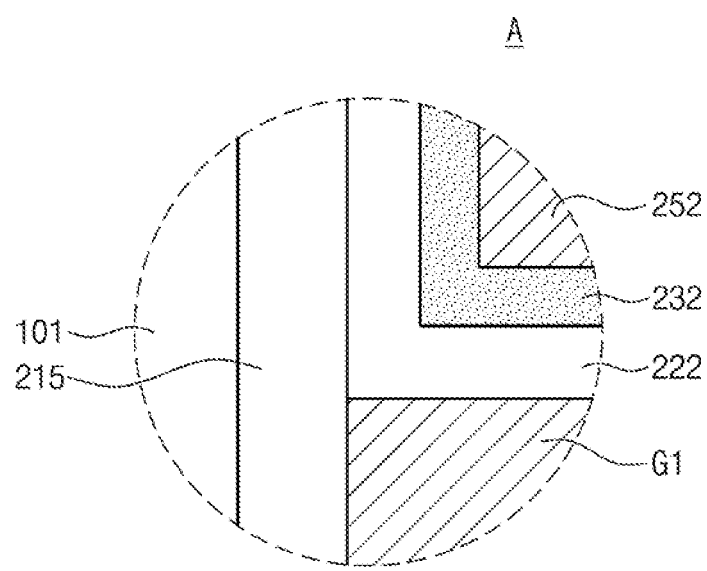
FIG. 12C is an enlarged view of a region 'A' of FIG. 12A illustrating a method of manufacturing a semiconductor memory device, according to an exemplary embodiment of the present inventive concept.
Figure 13A:
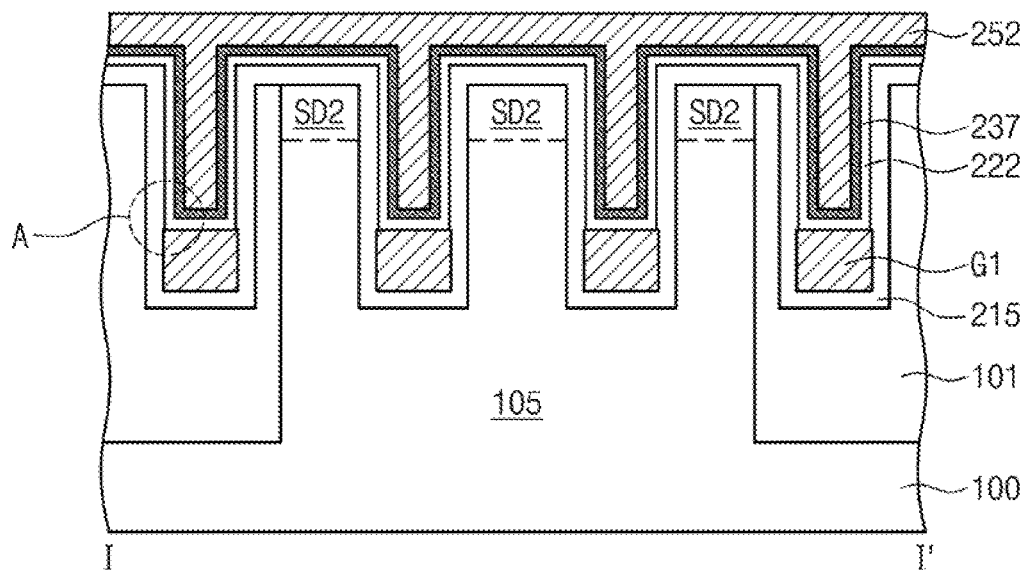

FIGS. 9A, 10A, 11A, 12A, 13A, 14A and 15A are cross-sectional views taken along the line I-I' of FIG. 1 illustrating a method of manufacturing a semiconductor memory device, according to an exemplary embodiment of the present inventive concept. FIGS. 9B, 10B, 11B, 12B, 13H, 14B and 15B are cross-sectional views taken along the line II-II' of FIG. 1 illustrating a method of manufacturing a semiconductor memory device, according to an exemplary embodiment of the present inventive concept. FIG. 12C is an enlarged view of a region 'A' of FIG. 12A illustrating a method of manufacturing a semiconductor memory device, according to an exemplary embodiment of the present inventive concept. FIGS. 13C and 13D are enlarged views of a region 'A' of FIG. 13A illustrating a method of manufacturing a semiconductor memory device, according to an exemplary embodiment of the present inventive concept. FIG. 12C corresponds to a region 'A' of FIG. 12A, and FIGS. 13C and 13D correspond to a region 'A' of FIG. 13A.

Figure 9A:
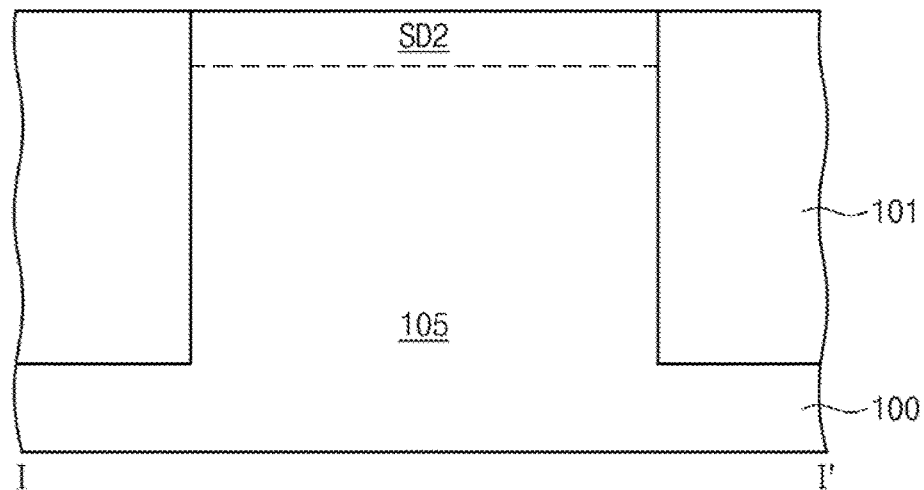
FIGS. 9A, 10A, 11A, 12A, 13A, 14A and 15A are cross-sectional views taken along the line I-I' of FIG. 1 illustrating a method of manufacturing a semiconductor memory device, according to an exemplary embodiment of the present inventive concept.
Figure 9A:
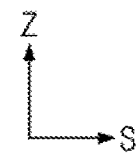
Figure 9B:
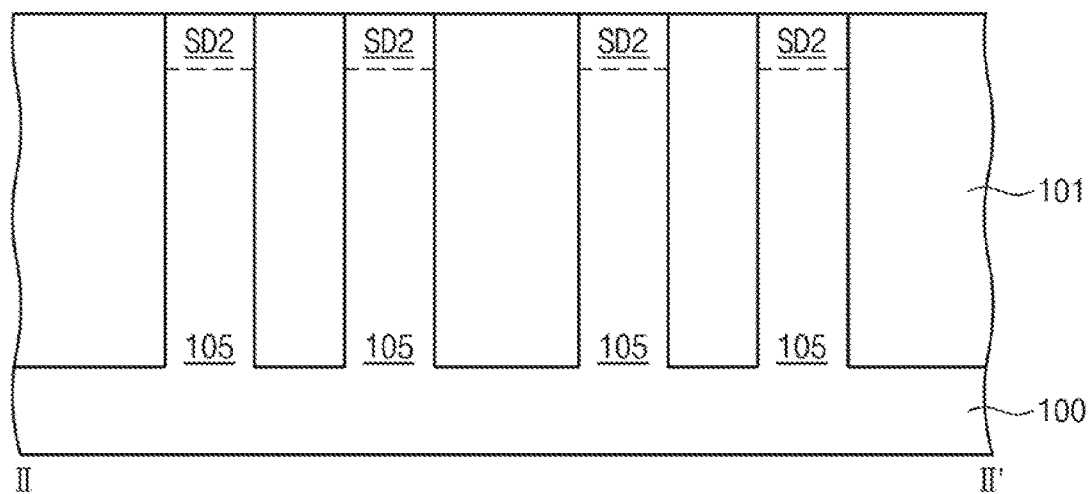
FIGS. 9B, 10B, 11B, 12B, 13B, 14B and 15B are cross-sectional views taken along the line II-II' of FIG. 1 illustrating a method of manufacturing a semiconductor memory device, according to an exemplary embodiment of the present inventive concept.
Figure 9B:
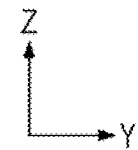

Referring to FIGS. 9A and 9B, the separation member 101 may be formed at the substrate 100 to define active regions 105. For example, the separation member 101 may be formed using a shallow-trench isolation (STI) method. The separation member 101 may include at least one of a silicon nitride layer, a silicon oxide layer, or a silicon oxynitride layer. The separation member 101 may extend into the substrate 100.

Second dopant injection regions SD2 may be formed in the active regions 105 of the substrate 100. The second dopant injection region SD2 may be formed using an ion implantation process. For example, the second dopant injection region SD2 may be doped with N-type dopants.

Referring to FIGS. 10A and 10B, mask patterns 110 may be formed on the substrate 100. The mask patterns 110 may be formed to have openings 115 that define regions in which gate lines (described in more detail below) may be formed. The mask patterns 110 may be hard mask patterns formed of, e.g., silicon nitride or photoresist patterns. The substrate 100 and the separation member 101 may be etched using the mask patterns 110 as an etch mask to form trenches 120 having linear shapes extending in the second direction Y. Bottom surfaces of the trenches 120 may expose the separation member 101 and the active regions 105.

The mask patterns 110 may be removed after the etching process is performed. For example, when the mask patterns 110 are the photoresist patterns, the mask patterns 110 may be removed by an aching process. When the mask patterns 110 are the hard mask patterns formed of, e.g., silicon nitride, the mask patterns 110 may be removed by a cleaning process using phosphoric acid.

Referring to FIGS. 11A and 11B, an insulating layer 215 may be formed on the substrate 100 having the trenches 120. The insulating layer 215 may be formed using a thermal oxidation process, an atomic layer deposition (ALD) process, and/or a chemical vapor deposition (CVD) process. For example, the insulating layer 215 may include a silicon oxide layer.

Thereafter, the lower electrode structure G1 may be formed in a lower portion of each of the trenches 120 in which the insulating layer 215 is formed. As an example, a conductive material may be deposited on substantially an entire top surface of the substrate 100 having the insulating layer 215. At this time, the conductive material may substantially fill the trenches 120. The deposition of the conductive material may be performed using a chemical vapor deposition (CVD) process. The conductive material may include at least one of a doped semiconductor material (e.g., doped silicon or doped germanium), a conductive metal nitride (e.g., titanium nitride or tantalum nitride), a metal (e.g., tungsten, titanium, or tantalum), or a metal-semiconductor compound (e.g., tungsten silicide, cobalt silicide, or titanium silicide). Subsequently, the deposited conductive material may be etched to form the lower electrode structures G1. The etching process may be continuously performed until the conductive material remains with a desired thickness in the trenches 120.

Referring to FIGS. 12A, 12B, and 12C, a preliminary source layer 222 may be formed on the substrate 100. The preliminary source layer 222 may be formed to conformally cover top surfaces of the lower electrode structures G1 and the insulating layer 215. The preliminary source layer 222 may be formed using a chemical vapor deposition (CVD) process. The preliminary source layer 222 may include a work-function adjustment element or a compound of the work-function adjustment element. For example, the work-function adjustment element may include a metal such as lanthanum, strontium, antimony, yttrium, aluminum, tantalum, hafnium, iridium, zirconium, or magnesium.

A first preliminary diffusion layer 232 may be formed on the substrate 100. The first preliminary diffusion layer 232 may be formed to conformally cover the preliminary source layer 222. The first preliminary diffusion layer 232 may be formed using a chemical vapor deposition (CND) process. The first preliminary diffusion layer 232 may include a metal material or a nitride of the metal material. The metal material may include a metal element different from the work-function adjustment element. For example, the metal material may include a metal element such as titanium or tungsten.

A conductive layer 252 may be formed on the substrate 100. The conductive layer 252 may fill remaining portions of the trenches 120 and may cover substantially an entire top surface of the substrate 100 having the first preliminary diffusion layer 232. For example, the conductive layer 252 may cover substantially an entire surface of the first preliminary diffusion layer 232 opposite the preliminary source layer 222. The conductive layer 252 may include a low-resistance material of which a resistance is lower than that of the first preliminary diffusion layer 232. For example, the conductive layer 252 may include a metal such as tungsten, titanium, or tantalum. The conductive layer 252 including a conductive material may be formed on the first preliminary diffusion layer 232 including the metal or the metal nitride.

Figure 13B:
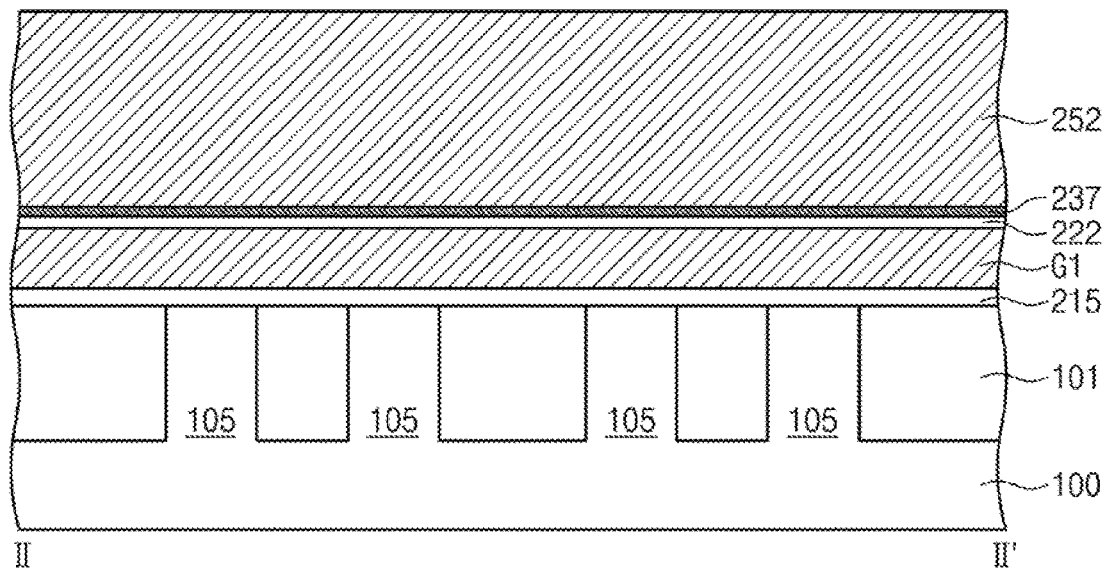
Figure 13C:
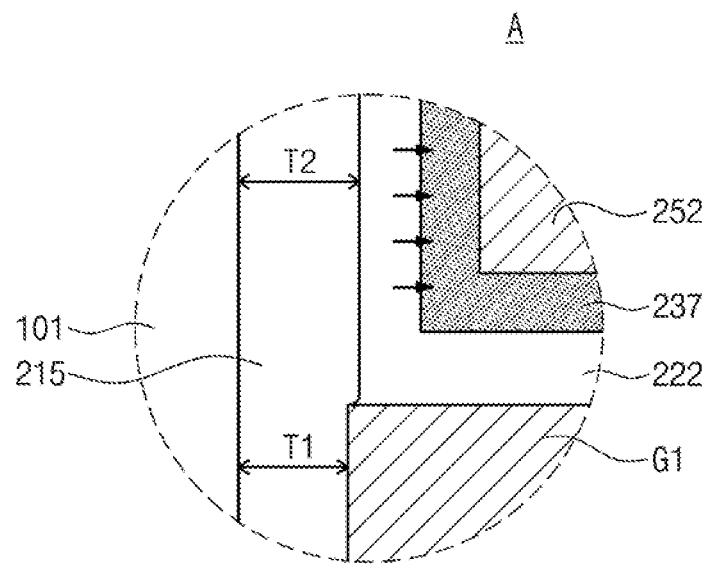
FIGS. 13C and 13D are enlarged views of a region 'A' of FIG. 13A illustrating a method of manufacturing a semiconductor memory device, according to an exemplary embodiment of the present inventive concept.
Figure 13D:
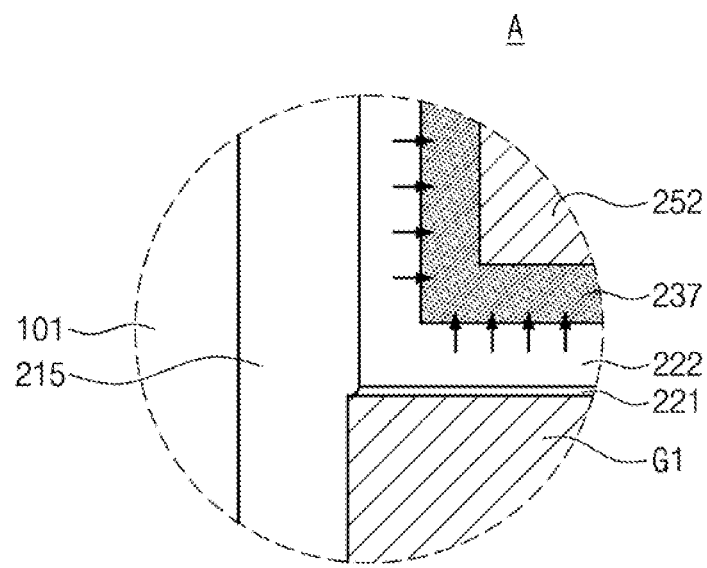

Referring to FIGS. 13A, 13B, and 13C, a preliminary work-function adjustment layer 237 may be formed by doping the first preliminary diffusion layer 232 with the work-function adjustment element. The preliminary work-function adjustment layer 237 may have an effective work function lower than that of the first preliminary diffusion layer 232. For example, the work-function adjustment element of the preliminary source layer 222 may be diffused into the first preliminary diffusion layer 232 to form the preliminary work-function adjustment layer 237. The diffusion of the work-function adjustment element may be performed by a thermal treatment process (e.g., an annealing process). The work-function adjustment element of the preliminary source layer 222 may be diffused into the first preliminary diffusion layer 232 along arrows of FIG. 13C by the thermal treatment process. At this time, substantially the entire first preliminary diffusion layer 232 may be doped with the work-function adjustment element, and thus the first preliminary diffusion layer 232 may be completely formed or converted into the preliminary work-function adjustment layer 237. Thus, the first preliminary diffusion layer 232 need not remain after the diffusion of the work-function adjustment element of the preliminary source layer 222 into the first preliminary diffusion layer 232. Since the work-function adjustment element of the preliminary source layer 222 is diffused into the first preliminary diffusion layer 232, a thickness of the preliminary source layer 222 may be reduced.

According to an exemplary embodiment of the present inventive concept, when the preliminary source layer 222 includes the compound of the work-function adjustment element, the compound of the work-function adjustment element may be an oxide or a nitride. In this case, the compound of the work-function adjustment element may be decomposed by the thermal treatment process, and thus the work-function adjustment element may be diffused into the first preliminary diffusion layer 232 and remaining oxygen or nitrogen may be diffused into the insulating layer 215. Thus, a width T2 of a portion of the insulating layer 215, being in direct contact with the preliminary source layer 222, may be increased. As the diffusion process is performed, the portion of the insulating layer 215 being in direct contact with the preliminary source layer 222 may gradually protrude in a direction toward the inside of the trench 120. For example, the width T2 of the portion, being in direct contact with the preliminary source layer 222, of the insulating layer 215 may be greater than a width T1 of another portion, being in direct contact with the lower electrode structure G1, of the insulating layer 215. At this time, a protruding thickness, into the trench 120, of the portion of the insulating layer 215 being in direct contact with the preliminary source layer 222 may be equal to or smaller than a thickness of the preliminary source layer 222.

In an exemplary embodiment of the present inventive concept, oxygen or nitrogen generated by decomposing the compound of the work-function adjustment element may be diffused toward the lower electrode structure G1. As an example, referring to FIG. 13D, the work-function adjustment element generated by the decomposition of the thermal treatment process may be diffused into the first preliminary diffusion layer 232 and the remaining oxygen or nitrogen may be diffused toward the lower electrode structure G1. The oxygen or nitrogen may move between the lower electrode structure G1 and the preliminary source layer 222 to form the gap 221 between the lower electrode structure G1 and the preliminary source layer 222. Referring to FIGS. 13A, 13B, and 13C, after the diffusion process (e.g., the thermal treatment process), substantially the entire first preliminary diffusion layer 232 may be doped with the work-function adjustment element and the first preliminary diffusion layer 232 might not remain. However, exemplary embodiments of the present inventive concept are not limited thereto. In an exemplary embodiment of the present inventive concept, a portion of the first preliminary diffusion layer 232 adjacent to the conductive layer 252 need not be doped with the work-function adjustment element, but may remain. In this case, the semiconductor memory device described with reference to FIG. 5 may be manufactured through subsequent processes to be described below in more detail.

Figure 14A:
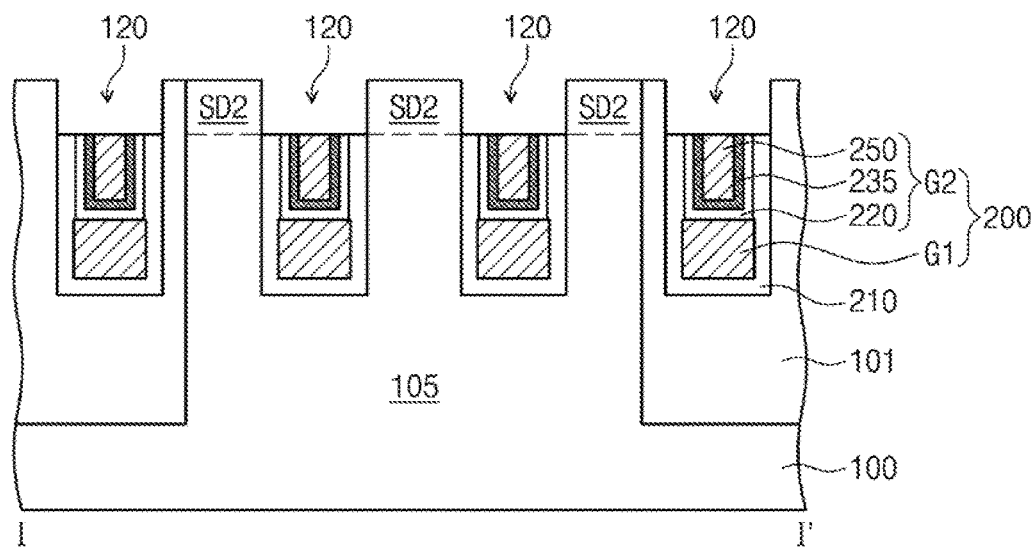
Figure 14B:
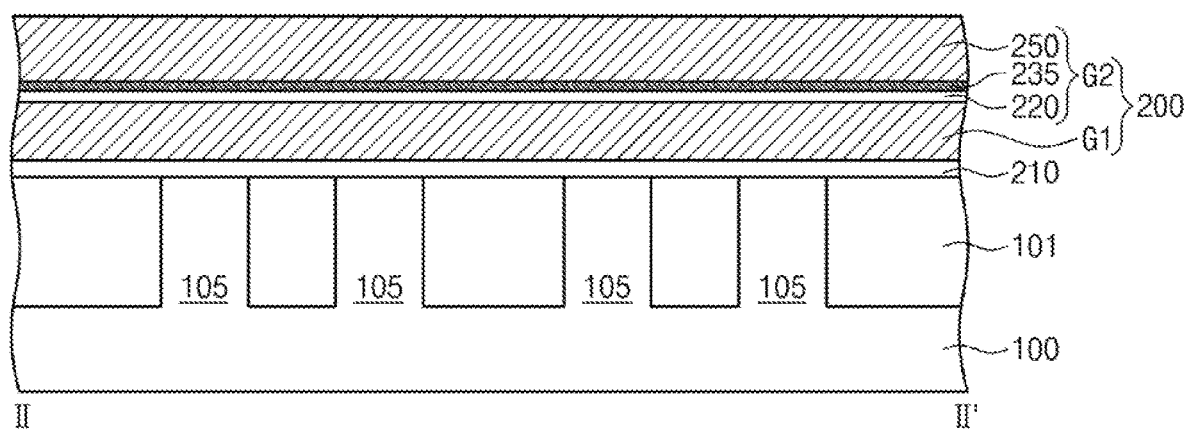

Referring to FIGS. 14A and 14B, the conductive layer 252, the preliminary work-function adjustment layer 237, and the preliminary source layer 222 may be etched to form an upper electrode structure G2 in each of the trenches 120. For example, the conductive layer 252 may be etched to form the conductive layer 250, the preliminary work-function adjustment layer 237 may be etched to form the work-function adjustment layer 235, and the preliminary source layer 222 may be etched to form the source layer 220. The etching process may be continuously performed until the preliminary source layer 222, the preliminary work-function adjustment layer 237 and the conductive layer 252 remain with desired thicknesses in the trenches 120. Top surfaces of the source layer 220, the work-function adjustment layer 235 and the conductive layer 250 formed by the etching process may be disposed at the same level.

Thereafter, the insulating layer 215 which is not covered by the upper electrode structure G2 but is exposed may be removed. Thus, gate insulating patterns 210 may be formed between the active regions 105 and the electrode structures G1 and G2 and/or between the separation member 101 and the electrode structures G1 and G2. In addition, top surfaces of the separation member 101 and the active regions 105 may be exposed by the etching process.

Figure 15A:
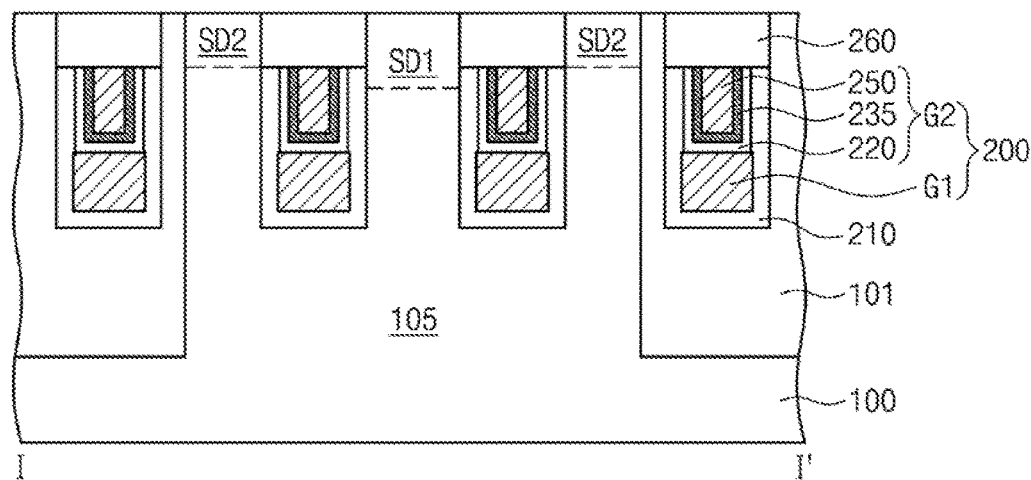
Figure 15B:
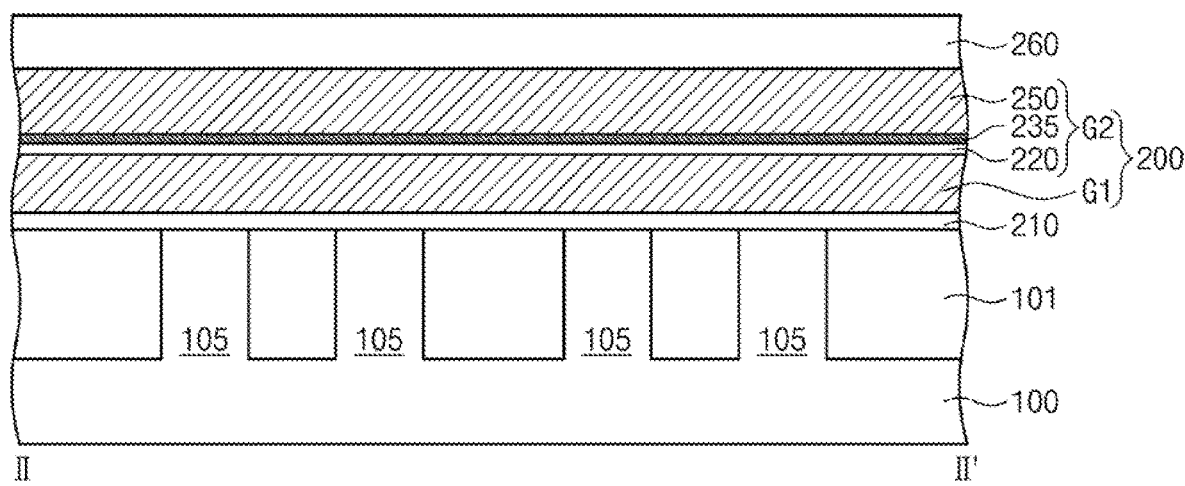

Referring to FIGS. 15A and 15B, first capping patterns 260 may be formed in the trenches 120, respectively. For example, a capping layer may be formed on substantially an entire top surface of the substrate 100, and then, a planarization process may be performed on the capping layer to form the first capping patterns 260. The first capping patterns 260 may include at least one of a silicon nitride layer, a silicon oxide layer, or a silicon oxynitride layer.

In an exemplary embodiment of the present inventive concept, the diffusion process of the work-function adjustment element described with reference to FIGS. 13A to 13C may be performed after formation of the source layer 220, the first diffusion layer 230 and the conductive layer 250. For example, the annealing process may be performed on the source layer 220, the first diffusion layer 230, and the conductive layer 250. The work-function adjustment element of the source layer 220 may be diffused into the first diffusion layer 230 to form the work-function adjustment layer 235. Substantially the entire first diffusion layer 230 may be doped with the work-function adjustment element by the diffusion process, and the first diffusion layer 230 need not remain after the diffusion process. Alternatively, a portion of the first diffusion layer 230 may remain after the diffusion process. In an exemplary embodiment of the present inventive concept, the diffusion process of the work-function adjustment element may be performed immediately after the formation of the source layer 220, the first diffusion layer 230 and the conductive layer 250 or may be performed during a process of manufacturing the semiconductor memory device after the formation of the source layer 220, the first diffusion layer 230 and the conductive layer 250.

An ion implantation process may be performed on the substrate 100 to form first dopant injection regions SD1 in the active regions 150 between two gate lines 200 adjacent to each other. The first dopant injection region SD1 may have the same conductivity type as the second dopant injection region SD2. For example, the first dopant injection region SD1 may be doped with N-type dopants. The first dopant injection region SD1 may be deeper than the second dopant injection region SD2 in the substrate 100.

Referring again to FIGS. 2A and 2B, a poly-silicon layer doped with dopants, single-crystalline silicon layer doped with dopants, or a conductive layer may be formed on the substrate 100 and then may be patterned to form first pads 310 and second pads 320. The first pads 310 may be connected to the first dopant injection regions SD1, and the second pads 320 may be connected to the second dopant injection regions SD2. When the first pads 310 and the second pads 320 include the poly-silicon layer or single-crystalline silicon layer doped with dopants, the first pads 310 and the second pads 320 may be doped with the same type of dopants as the first and second dopant injection regions SD1 and SD2, respectively.

The first interlayer insulating layer 400 may be formed on the first and second pads 310 and 320. The first interlayer insulating layer 400 may be formed using a chemical vapor deposition (CVD) process. The first interlayer insulating layer 400 may include at least one of a silicon oxide layer, a silicon nitride layer, or a silicon oxynitride layer. The first interlayer insulating layer 400 may be patterned to form contact holes in which direct contacts 520 will be formed. A conductive material may be formed on the first interlayer insulating layer 400 to substantially fill the contact holes, and a capping layer may be formed on the conductive material. For example, the conductive material may include a metal and/or a doped semiconductor material. For example, the capping layer may include at least one of a silicon nitride layer, a silicon oxide layer, or a silicon oxynitride layer. The capping layer and the conductive material may be patterned to form bit lines 510 and second capping patterns 530 disposed on the bit lines 510. Direct contacts 520 may be formed in the contact holes. An insulating spacer layer may be conformally deposited on the first interlayer insulating layer 400, and the deposited insulating spacer layer may be anisotropically etched to form insulating spacers 540 covering sidewalls of the bit lines 510. The insulating spacers 540 may include at least one of a silicon nitride layer, a silicon oxide layer, or a silicon oxynitride layer.

The second interlayer insulating layer 550 may be formed on the first interlayer insulating layer 400, and a planarization process may be performed on the second interlayer insulating layer 550 to expose top surfaces of the second capping patterns 530. Thereafter, buried contacts 620 may be formed to penetrate the second and first interlayer insulating layers 550 and 400. The buried contacts 620 may be connected to the second pads 320. The buried contacts 620 may include a conductive material such as doped silicon and/or a metal. The support layer 700 may be formed on the second interlayer insulating layer 550. The support layer 700 may include a silicon oxide layer, a silicon nitride layer, or a silicon oxynitride layer. The support layer 700 may be formed using a chemical vapor deposition (CVD) process. First electrodes 650 may be formed to penetrate the support layer 700. The first electrodes 650 may be connected to the buried contacts 620. Each of the first electrodes 650 may be formed to have a hollow cylindrical shape having a closed bottom end. The dielectric layer 660 may be formed to conformally cover the first electrodes 650, and the second electrode 670 may be formed on the dielectric layer 660 to commonly cover the first electrodes 650. Thus, capacitors CA may be completed. The first and second electrodes 650 and 670 may include at least one of doped silicon, a metal, or a metal compound. Thus, the semiconductor memory device according to an exemplary embodiment of the present inventive concept may be completed.

Figure 16A:
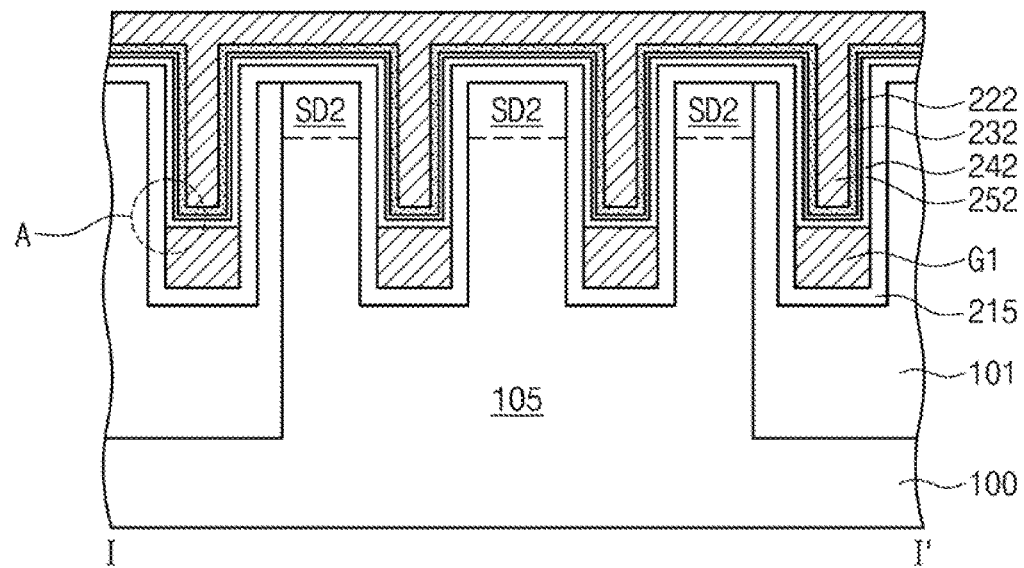
FIGS. 16A, 17A and 18A are cross-sectional views taken along the line I-I' of FIG. 1 illustrating a method of manufacturing a semiconductor memory device, according to an exemplary embodiment of the present inventive concept.
Figure 16B:
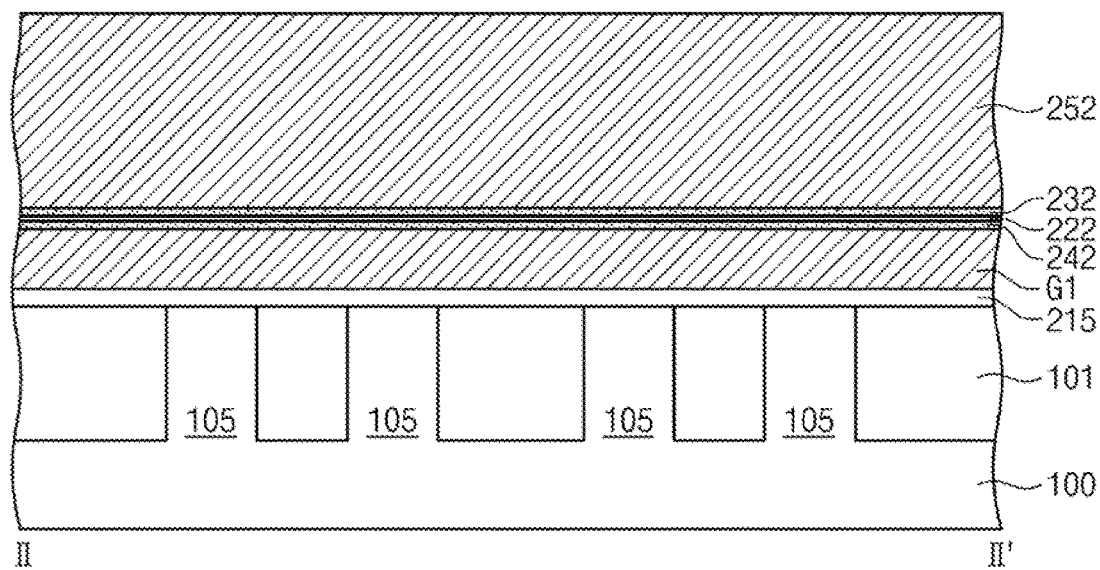
FIGS. 16B, 17B and 18B are cross-sectional views taken along the line II-II' of FIG. 1 illustrating a method of manufacturing a semiconductor memory device, according to an exemplary embodiment of the present inventive concept.
Figure 16C:
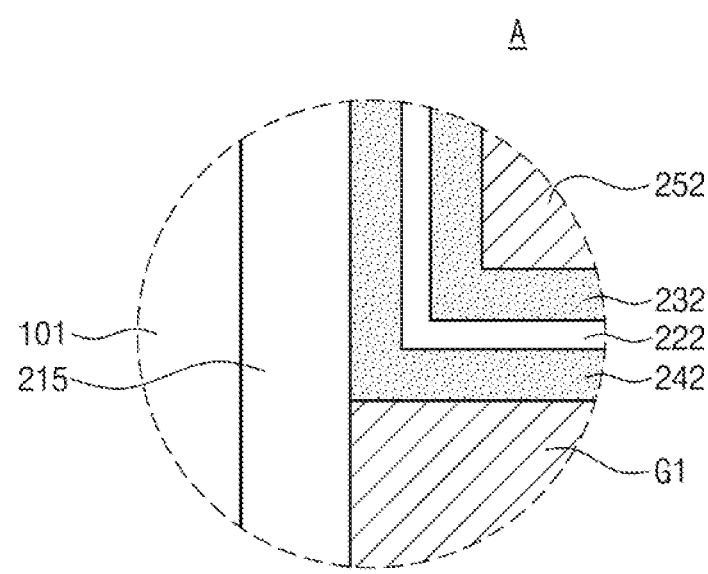
FIGS. 16C and 17C are enlarged views of regions 'A' of FIGS. 16A and 17A, respectively, illustrating a method of manufacturing a semiconductor memory device, according to an exemplary embodiment of the present inventive concept.
Figure 17A:
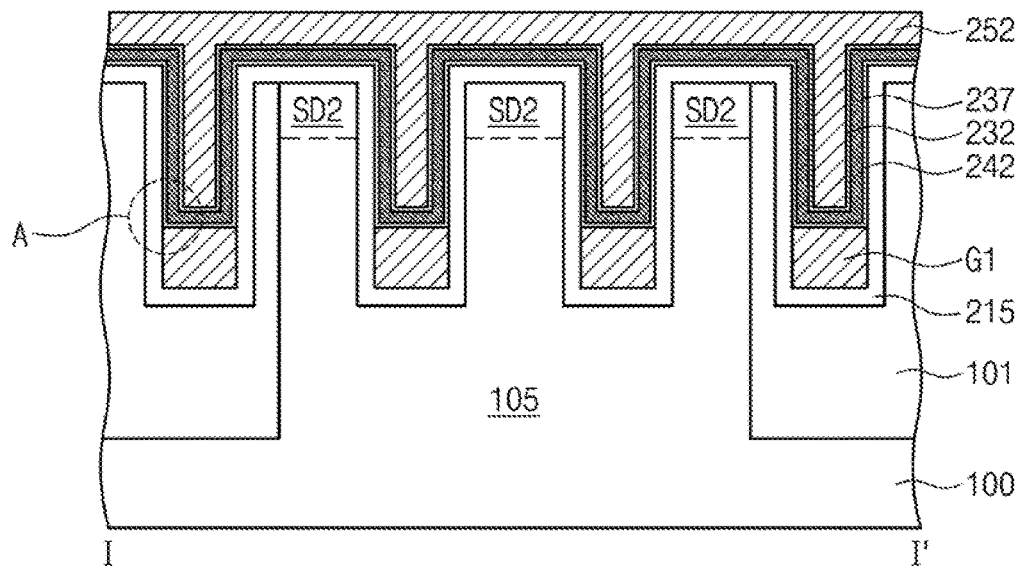
Figure 17A:
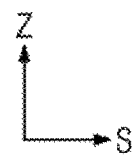
Figure 17B:
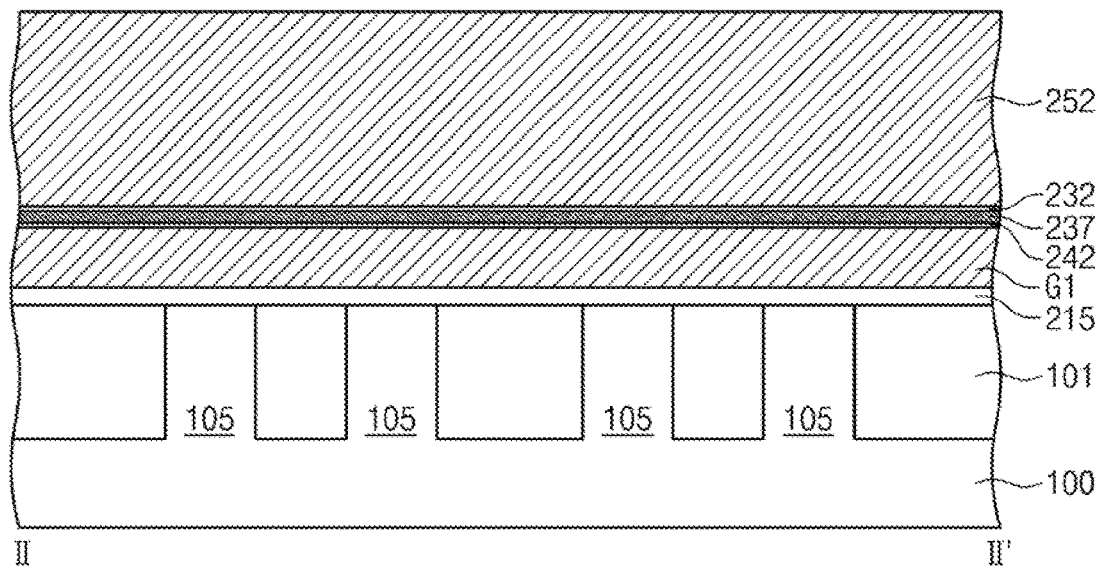
Figure 17B:
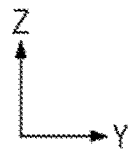
Figure 17C:
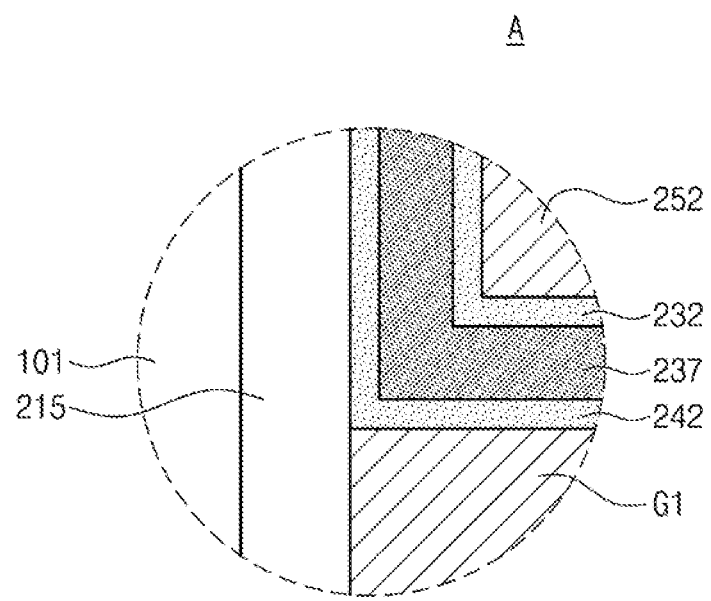
Figure 18A:
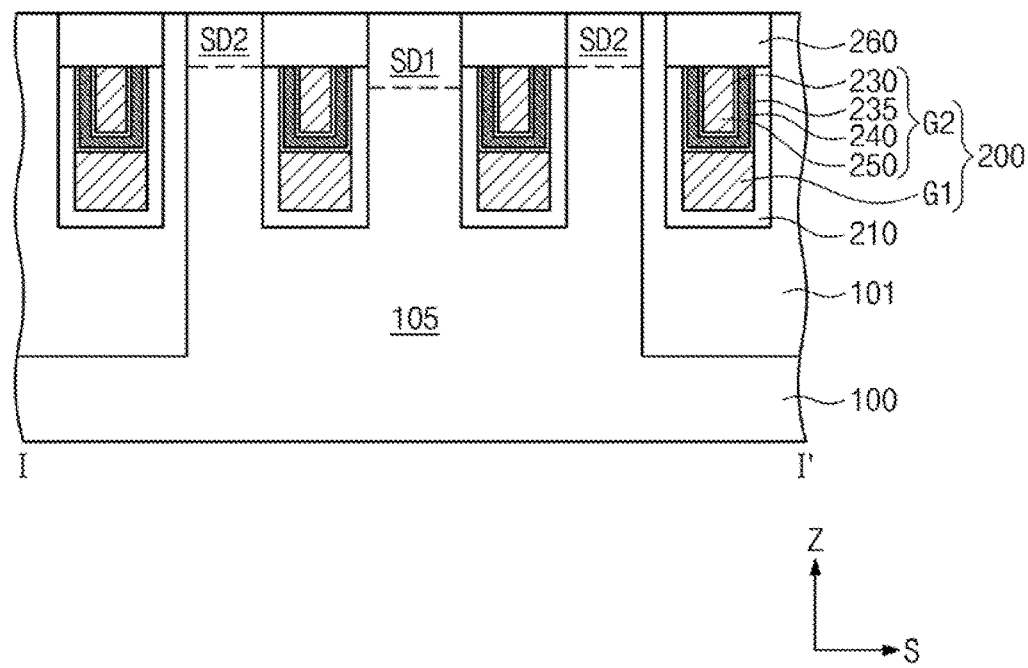
Figure 18B:
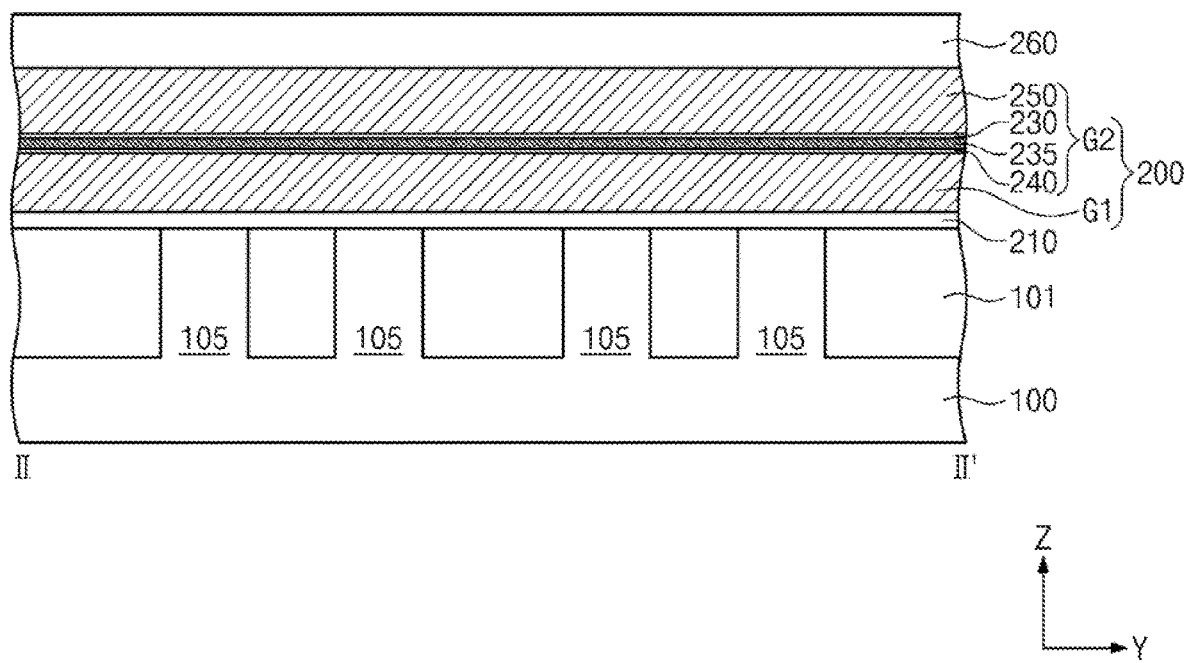

FIGS. 16A, 17A and 18A are cross-sectional views taken along the line I-I' of FIG. 1 illustrating a method of manufacturing a semiconductor memory device, according to an exemplary embodiment of the present inventive concept. FIGS. 16B, 17B and 18B are cross-sectional views taken along the line II-II' of FIG. 1 illustrating a method of manufacturing a semiconductor memory device, according to an exemplary embodiment of the present inventive concept. FIGS. 16C and 17C are enlarged views of regions 'A' of FIGS. 16A and 17A, respectively, illustrating a method of manufacturing a semiconductor memory device, according to an exemplary embodiment of the present inventive concept.

Referring to FIGS. 16A, 16B, and 16C, a second preliminary diffusion layer 242 may be formed on the resultant structure of FIGS. 11A and 11B. The second preliminary diffusion layer 242 may be formed to conformally cover top surfaces of the lower electrode structures G1 and the insulating layer 215. The second preliminary diffusion layer 242 may include a metal material or a nitride of the metal material. For example, the metal material may include a metal element such as titanium or tungsten.

A preliminary source layer 222 may be formed on the substrate 100. The preliminary source layer 222 may be formed to conformally cover the second preliminary diffusion layer 242. The preliminary source layer 222 may include a work-function adjustment element or a compound of the work-function adjustment element. The work-function adjustment element may include a metal element of which a work function is lower than that of the metal material. For example, the work-function adjustment element may include a metal such as lanthanum, strontium, antimony, yttrium, aluminum, tantalum, hafnium, iridium, zirconium, or magnesium.

A first preliminary diffusion layer 232 may be formed on the substrate 100. The first preliminary diffusion layer 232 may be formed to conformally cover the preliminary source layer 222. The first preliminary diffusion layer 232 may include the same metal material or the same nitride of the metal material as the second preliminary diffusion layer 242. For example, the metal material may include a metal element such as titanium or tungsten.

A conductive layer 252 may be formed on the substrate 100. The conductive layer 252 may fill remaining portions of the trenches 120 and may cover substantially an entire top surface of the substrate 100 having the first preliminary diffusion layer 232. The conductive layer 252 may include a low-resistance material of which a resistance is lower than that of the first preliminary diffusion layer 232. For example, the conductive layer 252 may include a metal such as tungsten, titanium, or tantalum.

Referring to FIGS. 17A, 17B, and 17C, a preliminary work-function adjustment layer 237 may be formed by doping the first preliminary diffusion layer 232 and the second preliminary diffusion layer 242 with the work-function adjustment element. The preliminary work-function adjustment layer 237 may have an effective work function lower than those of the first preliminary diffusion layer 232 and the second preliminary diffusion layer 242. For example, the work-function adjustment element of the preliminary source layer 222 may be diffused into a portion of the first preliminary diffusion layer 232 and a portion of the second preliminary diffusion layer 242. Substantially all of the work-function adjustment element of the preliminary source layer 222 may be diffused into the first preliminary diffusion layer 232 and the second preliminary diffusion layer 242. Thus, the preliminary source layer 222 may be completely consumed and thus need not remain. Thus, the portions of the first and second preliminary diffusion layers 232 and 242 doped with the work-function adjustment element may be in direct contact with each other to form the preliminary work-function adjustment layer 237. The diffusion of the work-function adjustment element may be performed by a thermal treatment process (e.g., an annealing process).

In FIGS. 17A, 17B, and 17C, the preliminary source layer 222 may be substantially completely consumed and thus need not remain. However, exemplary embodiments of the present inventive concept are not limited thereto. In an exemplary embodiment of the present inventive concept, the preliminary source layer 222 need not be completely consumed, and a portion of the preliminary source layer 222 may remain within the preliminary work-function adjustment layer 237.

Referring to FIGS. 18A and 18B, the conductive layer 252, the first preliminary diffusion layer 232, the preliminary work-function adjustment layer 237, and the second preliminary diffusion layer 242 may be etched to form the upper electrode structure G2 in each of the trenches 120. The conductive layer 252 may be etched to form the conductive layer 250, and the second preliminary diffusion layer 242 may be etched to form a second diffusion layer 240. The preliminary work-function adjustment layer 237 may be etched to form the work-function adjustment layer 235, and the first preliminary diffusion layer 232 may be etched to from the first diffusion layer 230. The insulating layer 215 which is not covered by the upper electrode structure G2 but is exposed may be removed. First capping patterns 260 may be formed in the trenches 120.

Thereafter, the processes described above with reference to FIGS. 2A and 2B may be performed on the resultant structure of FIGS. 18A and 18B to complete the semiconductor memory device according to an exemplary embodiment of the present inventive concept.

According to an exemplary embodiment of the present inventive concept, it is possible to reduce or minimize the gate induced drain leakage current (GIDL) which may be generated from the gate lines to the dopant injection regions.

In addition, according to an exemplary embodiment of the present inventive concept, the work function of the lower electrode structure need not be reduced, and thus the threshold voltage may be maintained at a relatively high level.

While the inventive concept has been particularly shown and described with reference to exemplary embodiments thereof, it will be understood by those of ordinary skill in the art that various changes in form and detail may be made therein without departing from the spirit and scope of the inventive concept.

What is claimed is:

1. A method of manufacturing a semiconductor memory device, the method comprising:
   forming a separation member defining active regions in a substrate; and
   forming gate lines intersecting the active regions and buried in the substrate,
   wherein the forming of the gate lines comprises:
      forming trenches intersecting the active regions in the substrate;
      forming a lower electrode structure substantially filling a lower portion of each of the trenches;
      sequentially forming a source layer and a first diffusion layer on a sidewall and a bottom surface of each of the trenches, the source layer including a work-function adjustment element;
      forming a conductive layer on the first diffusion layer; and
      forming a work-function adjustment layer having a work function lower than that of the first diffusion layer by diffusing the work-function adjustment element from the source layer into at least a portion of the first diffusion layer.

2. The method of claim 1, wherein a portion of the first diffusion layer remains after the forming of the work-function adjustment layer.

3. The method of claim 1, wherein the source layer and the conductive layer are spaced apart from each other by the work-function adjustment layer.

4. The method of claim 1, wherein the diffusion of the work-function adjustment element is performed by an annealing process.

5. The method of claim 1, further comprising:
   forming a gate insulating pattern on the sidewall and the bottom surface of each of the trenches before the forming of the lower electrode structure,
   wherein a portion of the gate insulating pattern in direct contact with the source layer laterally protrudes on the lower electrode structure in the forming of the work-function adjustment layer.

6. The method of claim 5, oxygen atoms of the source layer are diffused into the gate insulating pattern when the forming of the work-function adjustment layer.

7. The method of claim 1, wherein the source layer is formed between the first diffusion layer and a sidewall of each of the trenches.

8. The method of claim 1, wherein a gap formed between the lower electrode structure and the source layer when the forming of the work-function adjustment layer, and
   wherein the gap is substantially filled with oxygen or nitrogen.

9. The method of claim 1, wherein a work function of the lower electrode structure is higher than a work function of the work-function adjustment layer.

10. The method of claim 1, wherein the work-function adjustment layer includes a metal or a metal nitride, and
    wherein the work-function adjustment element includes lanthanum (La).

11. The method of claim 1, further comprising:
    forming a second diffusion layer on a sidewall of each of the trenches before the forming of the source layer.

12. The method of claim 11, wherein the work-function adjustment element is diffused into at least a portion of the second diffusion layer from the source layer when the forming of the work-function adjustment layer.

13. A method of manufacturing a semiconductor memory device, the method comprising:
    forming trenches intersecting active regions in a substrate;
    forming a lower electrode structure substantially filling a lower portion of each of the trenches;
    sequentially forming a first diffusion layer, a source layer and a second diffusion layer on the lower electrode structure in the trench, the source layer including a work-function adjustment element;
    forming a conductive layer on the first diffusion layer; and
    forming a work-function adjustment layer having a work function lower than that of the first and second diffusions layer by diffusing the work-function adjustment element from the source layer into at least a portion of the first and second diffusion layers.

14. The method of claim 13, wherein the work-function adjustment layer is formed between the first diffusion layer and the second diffusion layer.

15. The method of claim 13, wherein a portion of the first diffusion layer and a portion of the second diffusion layer remain after the forming of the work-function adjustment layer.

16. The method of claim 13, wherein source layer remain at least one of between the first diffusion layer and the work-function adjustment layer or between the second diffusion layer and the work-function adjustment layer after the forming of the work-function adjustment layer.

17. The method of claim 13, the first diffusion layer, the source layer and the second diffusion layer are formed on a sidewall and a bottom surface of each of the trenches.

18. The method of claim 13, wherein the diffusion of the work-function adjustment element is performed by an annealing process.

19. The method of claim 13, further comprising:
    forming a gate insulating, pattern on the sidewall and the bottom surface of each of the trenches before the forming of the lower electrode structure.

20. The method of claim 13, wherein the work-function adjustment layer includes a metal or a metal nitride,
    wherein the first and second diffusion layers include a same material as the work-function adjustment layer, and
wherein the work-function adjustment element includes lanthanum (La).

* * * * *